(12) United States Patent
Nikkila et al.

(10) Patent No.: US 10,103,839 B2
(45) Date of Patent: Oct. 16, 2018

(54) PROCESSING AND ERROR CONCEALMENT OF DIGITAL SIGNALS

(75) Inventors: Seppo Nikkila, Helsinki (FI); Tom Lindeman, Helsinki (FI)

(73) Assignee: ANT-ADVANCED NETWORK TECHNOLOGIES OY, Helsinki (FI)

( * ) Notice: Subject to any disclaimer, the term of this patent is extended or adjusted under 35 U.S.C. 154(b) by 0 days.

(21) Appl. No.: 14/411,612

(22) PCT Filed: Jun. 28, 2012

(86) PCT No.: PCT/FI2012/050678
§ 371 (c)(1),
(2), (4) Date: Mar. 11, 2015

(87) PCT Pub. No.: WO2014/001605
PCT Pub. Date: Jan. 3, 2014

(65) Prior Publication Data
US 2015/0249468 A1    Sep. 3, 2015

(51) Int. Cl.
*H04L 1/00* (2006.01)
*G10L 19/005* (2013.01)
(Continued)

(52) U.S. Cl.
CPC .......... *H04L 1/004* (2013.01); *G10L 19/005* (2013.01); *G10L 19/008* (2013.01); *H03M 13/25* (2013.01);
(Continued)

(58) Field of Classification Search
CPC .............................. H04L 1/004; G10L 19/005
See application file for complete search history.

(56) References Cited

U.S. PATENT DOCUMENTS 5,315,448 A * 5/1994 Ryan .................. H04N 5/913
                                                         360/60
6,125,140 A * 9/2000 Wilkinson ........... G11B 27/031
                                                         348/699
(Continued)

FOREIGN PATENT DOCUMENTS

EP    0 936 772    8/1999

OTHER PUBLICATIONS

International Search Report dated Feb. 26, 2013, corresponding to PCT/FI2012/050678.
(Continued)

*Primary Examiner* — Joseph D Torres
(74) *Attorney, Agent, or Firm* — Young & Thompson

(57) ABSTRACT

A method for forward error concealment encoding of a digital signal data stream including a sequence of individual digital samples, includes encoding one or more of the individual digital samples according to an encoding mode selected from a number of predetermined encoding modes in accordance with a value of the respective digital sample, wherein encoding includes determining an encoded digital sample as a combination of bits of the respective digital sample and a predetermined number of forward error concealment bits arranged into predetermined bit positions of the encoded digital sample in accordance with the selected encoding mode. A method for forward error concealment decoding of a digital signal data stream including a sequence of encoded individual digital samples is provided, and includes decoding one or more of the individual encoded samples into respective decoded digital samples according to a decoding mode selected from a number of predetermined decoding.

13 Claims, 38 Drawing Sheets

(51) Int. Cl.
*G10L 19/008* (2013.01)
*H03M 13/25* (2006.01)
*H03M 13/00* (2006.01)
*H04S 5/02* (2006.01)

(52) U.S. Cl.
CPC ......... *H03M 13/611* (2013.01); *H04L 1/007* (2013.01); *H04L 1/0045* (2013.01); *H04L 1/0061* (2013.01); *H04S 5/02* (2013.01); *H04S 2400/01* (2013.01)

(56) References Cited

U.S. PATENT DOCUMENTS

| | | | | |
|---|---|---|---|---|
| 6,357,029 | B1* | 3/2002 | Sinha | H04L 1/0054 714/701 |
| 6,405,338 | B1 | 6/2002 | Sinha et al. | |
| 2001/0040926 | A1* | 11/2001 | Hannuksela | H04N 21/43637 375/240.27 |
| 2003/0078773 | A1* | 4/2003 | Thyssen | G10L 19/07 704/230 |
| 2003/0078774 | A1* | 4/2003 | Thyssen | G10L 19/07 704/230 |
| 2005/0041734 | A1* | 2/2005 | Walker | G06T 9/004 375/240.01 |
| 2005/0144541 | A1* | 6/2005 | Homm | G10L 19/005 714/48 |
| 2006/0188025 | A1* | 8/2006 | Hannuksela | H04N 19/105 375/240.27 |
| 2006/0222078 | A1* | 10/2006 | Raveendran | H04N 21/2365 375/240.16 |
| 2008/0249768 | A1* | 10/2008 | Ertan | G10L 19/005 704/219 |
| 2008/0275905 | A1* | 11/2008 | Hannuksela | G06F 17/30017 |
| 2009/0252227 | A1* | 10/2009 | NepomucenoLeung | H04N 19/107 375/240.13 |
| 2009/0268809 | A1* | 10/2009 | Cordara | H04N 19/395 375/240.12 |

OTHER PUBLICATIONS

Ted Painter, et al.; "Perceptual Coding of Digital Audio"; vol. 88, No. 4; Apr. 1, 2000; pp. 460-461.

* cited by examiner

Fig. 2

The two preferred embodyments of the polynomial concealment method

1. Cubic Estimation — 9

Based on the use of 3rd order polynomials
Uses four sample points near the error
Fast with very low latency
Produces acceptable concealment
Cannot fully conceal 24-bit audio
No error position indication support Two modes of concealment:
 predictive,
 interpolative alignment

10

2. Polynomial Estimation with Bit Healing

Based on the use of from 3rd to 7th order polynomials
Uses four sample points before the error and up to four after it
Fast with low extra latency (4 × sample periods)
Produces excellent concealment
Conceals the audio at 24-bit resolution
Bit error position indication for bit healing Sixteen polynomials for concealment Bit healing for both 16-bit and 24-bit modes
Bit error position indication
Bit healing is based on successive approximation relative to the polynomial sample estimate

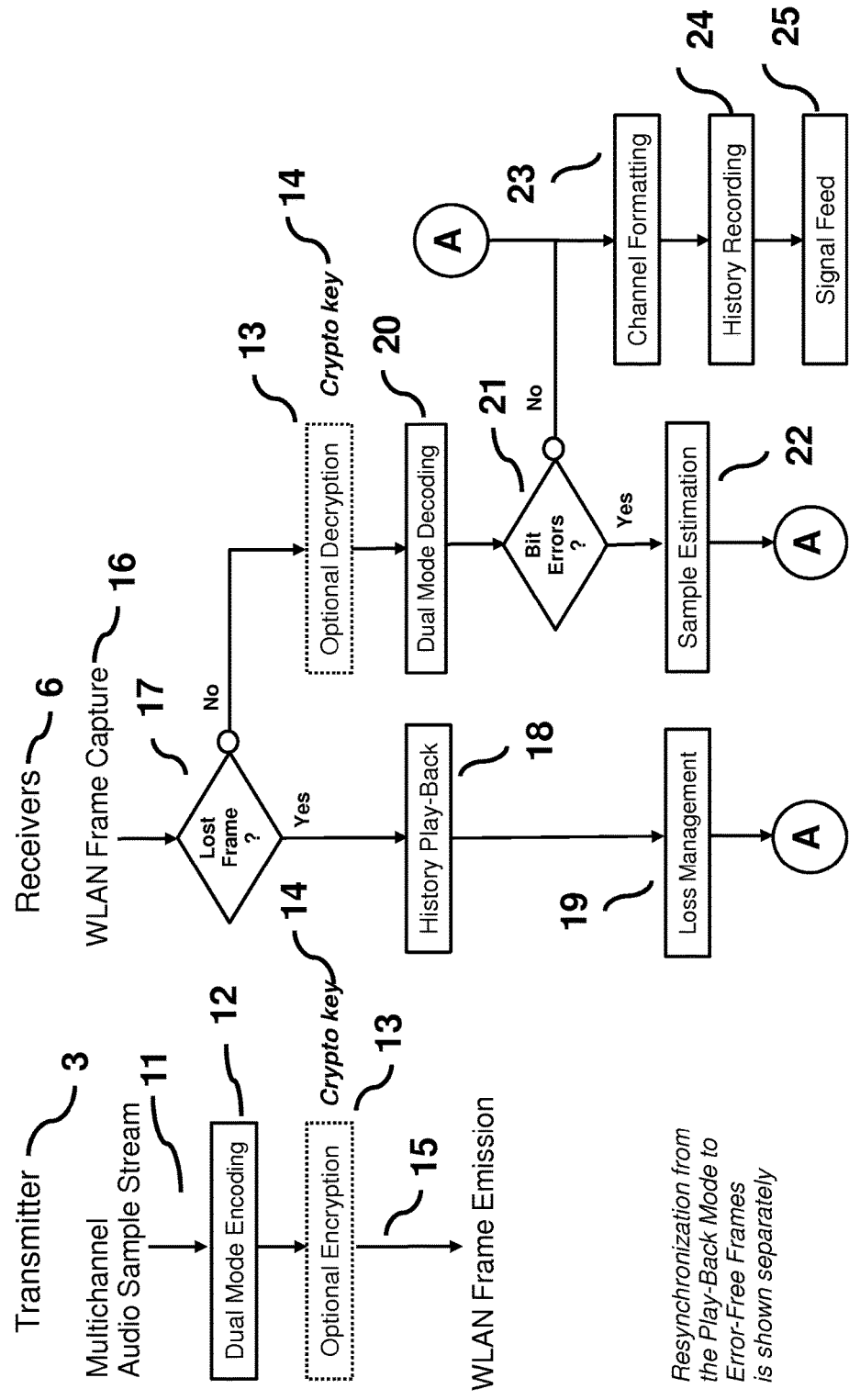

Polynomial Estimation with Bit Healing

Fig. 12

Cubic Predictive Estimation (CPE-410) Algorithm $\zeta = CA^{-1}Z^T$, calculation of the cubic extrapolation estimate, where    (1)

$$A = \begin{bmatrix} 0 & 0 & 0 & 1 \\ 1 & 1 & 1 & 1 \\ 8 & 4 & 2 & 1 \\ 27 & 9 & 3 & 1 \end{bmatrix}, \text{cubic extrapolation matrix for CPE-410,} \quad \sim 68$$

$C = [64 \ 16 \ 4 \ 1]$, cubic coefficients vector, ~69

$Z = [w_0 \ w_1 \ w_2 \ w_3]$, sample vector. ~70

$$A^{-1} = \begin{bmatrix} -1/6 & 1/2 & -1/2 & 1/6 \\ 1 & -5/2 & 2 & -1/2 \\ -11/6 & 3 & -3/2 & 1/3 \\ 1 & 0 & 0 & 0 \end{bmatrix} \quad \sim 71$$

$CA^{-1} = [-1 \ 4 \ -6 \ 4\ ]$ ~72

$\zeta = CA^{-1}Z^T = -w_0 + 4w_1 - 6w_2 + 4w_3$    (2)
~73

*One two's complementation, three integer multiplications, and three integer additions*

Fig. 13

Cubic Alignment Estimation (CAE-311) Algorithm $\zeta = \mathbf{CA^{-1}Z^T}$, calculation of the cubic interpolation estimate, where $$\mathbf{A} = \begin{bmatrix} 0 & 0 & 0 & 1 \\ 1 & 1 & 1 & 1 \\ 8 & 4 & 2 & 1 \\ 64 & 16 & 4 & 1 \end{bmatrix}, \text{cubic 3+1 point interpolation matrix for CAE-311,} \quad \sim 74 \quad (1)$$

69 ⌒

$\mathbf{C} = [27 \ 9 \ 3 \ 1]$, cubic coefficients vector,

70 ⌒ $\mathbf{Z} = [w_0 \ w_1 \ w_2 \ w_4]$, sample vector

75 ⌒
$$\mathbf{A^{-1}} = \begin{bmatrix} -1/8 & 1/3 & -1/4 & 1/24 \\ 7/8 & -2 & 5/4 & -1/8 \\ -7/4 & 8/3 & -1 & 1/12 \\ 1 & 0 & 0 & 0 \end{bmatrix}$$

$\mathbf{CA^{-1}} = [\ 1/4 \ \ -1 \ \ 3/2 \ \ 1/4\ ]\ \sim 76$ $\zeta = \mathbf{CA^{-1}Z^T} = w_0/4 - w_1 + 3w_2/2 + w_4/4 \ \sim 77 \quad (3)$

*One two's complementation, one integer multiplications, three integer divisions, and three integer additions*

Fig. 14

Cubic Alignment Estimation (CAE-212) Algorithm $\zeta = CA^{-1}Z^T$, calculation of the cubic interpolation estimate, where (1)

$A = \begin{bmatrix} 0 & 0 & 0 & 1 \\ 1 & 1 & 1 & 1 \\ 27 & 9 & 3 & 1 \\ 64 & 16 & 4 & 1 \end{bmatrix}$, cubic 2+2 point interpolation matrix for CAE-212, ~ 78

69 ~ $C = [\ 8\ \ 4\ \ 2\ \ 1]$, cubic coefficients vector,

70 ~ $Z = [w_0\ w_1\ w_3\ w_4]$, sample vector

79 ~ $A^{-1} = \begin{bmatrix} -1/12 & 1/6 & -1/6 & 1/12 \\ 2/3 & -7/6 & 5/6 & -1/3 \\ -19/12 & 2 & -2/3 & 1/4 \\ 1 & 0 & 0 & 0 \end{bmatrix}$ $CA^{-1} = [\ -1/6\ \ 2/3\ \ 2/3\ \ -1/6\ ]$ ~ 80

$\zeta = CA^{-1}Z^T = -w_0/6 + 2w_1/3 + 2w_3/3 - w_4/6$ (4) ~ 81

*Two integer multiplications, four integer divisions, and three integer additions*

Polynomial Estimation $$108 \quad x'[4] = \sum_{i=0}^{3} c[i] * x[i] + \sum_{i=5}^{8} c[i] * x[i] \quad (5)$$

Coefficients c[i] table: row (N) selection according to the error free samples x[5] – x[8]

| x[ ] | x[0] | x[1] | x[2] | x[3] | x[5] | x[6] | x[7] | x[8] | N | Name | Precedence Order |
|---|---|---|---|---|---|---|---|---|---|---|---|
| 1 | -1 | 4 | -6 | 4 | | | | | 0 | CPE-410 | 16  3 |
| 2 | -35/70 | 160/70 | -280/70 | 224/70 | | | | 1/70 | 1 | CAE-41_0001 | 15  4 |
| 3 | -15/35 | 70/35 | -126/35 | 105/35 | | | 1/35 | | 2 | CAE-41_0010 | 14  4 |
| 4 | -15/70 | 80/70 | -168/70 | 168/70 | | | 8/70 | -3/70 | 3 | CAE-41_0011 | 11  5 |
| 5 | -5/15 | 24/15 | -45/15 | 40/15 | | 1/15 | | | 4 | CAE-41_0100 | 13  4 |
| 6 | -35/210 | 192/210 | -420/210 | 448/210 | | 28/210 | | -3/210 | 5 | CAE-41_0101 | 10  5 |
| 7 | -5/35 | 28/35 | -63/35 | 70/35 | | 7/35 | -2/35 | | 6 | CAE-41_0110 | 9  5 |
| 8 | -5/70 | 32/70 | -84/70 | 112/70 | | 28/70 | -16/70 | 3/70 | 7 | CAE-41_0111 | 5  6 |
| 9 | -1/5 | 5/5 | -10/5 | 10/5 | 1/5 | | | | 8 | CAE-41_1000 | 12  4 |
| 10 | -21/210 | 120/210 | -280/210 | 336/210 | 56/210 | | | -1/210 | 9 | CAE-41_1001 | 8  5 |
| 11 | -6/70 | 35/70 | -84/70 | 105/70 | 21/70 | | -1/70 | | A | CAE-41_1010 | 7  5 |
| 12 | -3/70 | 20/70 | -56/70 | 84/70 | 28/70 | | -4/70 | 1/70 | B | CAE-41_1011 | 4  6 |
| 13 | -1/15 | 6/15 | -15/15 | 20/15 | 6/15 | -1/15 | | | C | CAE-41_1100 | 6  5 |
| 14 | -7/210 | 48/210 | -140/210 | 224/210 | 112/210 | -28/210 | | 1/210 | D | CAE-41_1101 | 3  6 |
| 15 | -1/35 | 7/35 | -21/35 | 35/35 | 21/35 | -7/35 | 1/35 | | E | CAE-41_1110 | 2  6 |
| 16 | -1/70 | 8/70 | -28/70 | 56/70 | 56/70 | -28/70 | 8/70 | -1/70 | F | CAE-414 | 1  7 |

109

24-Bit Nibble Mode Healing

Adaptive Slew Rate Limitation (ASRL)

Fig. 26 Dynamic Channel Formatting (DCF)

Signal History Buffer (40 KB, 208 1/3 ms) and Pointers

Play-Back from Signal History Buffer

Exit from the Play-Back Mode

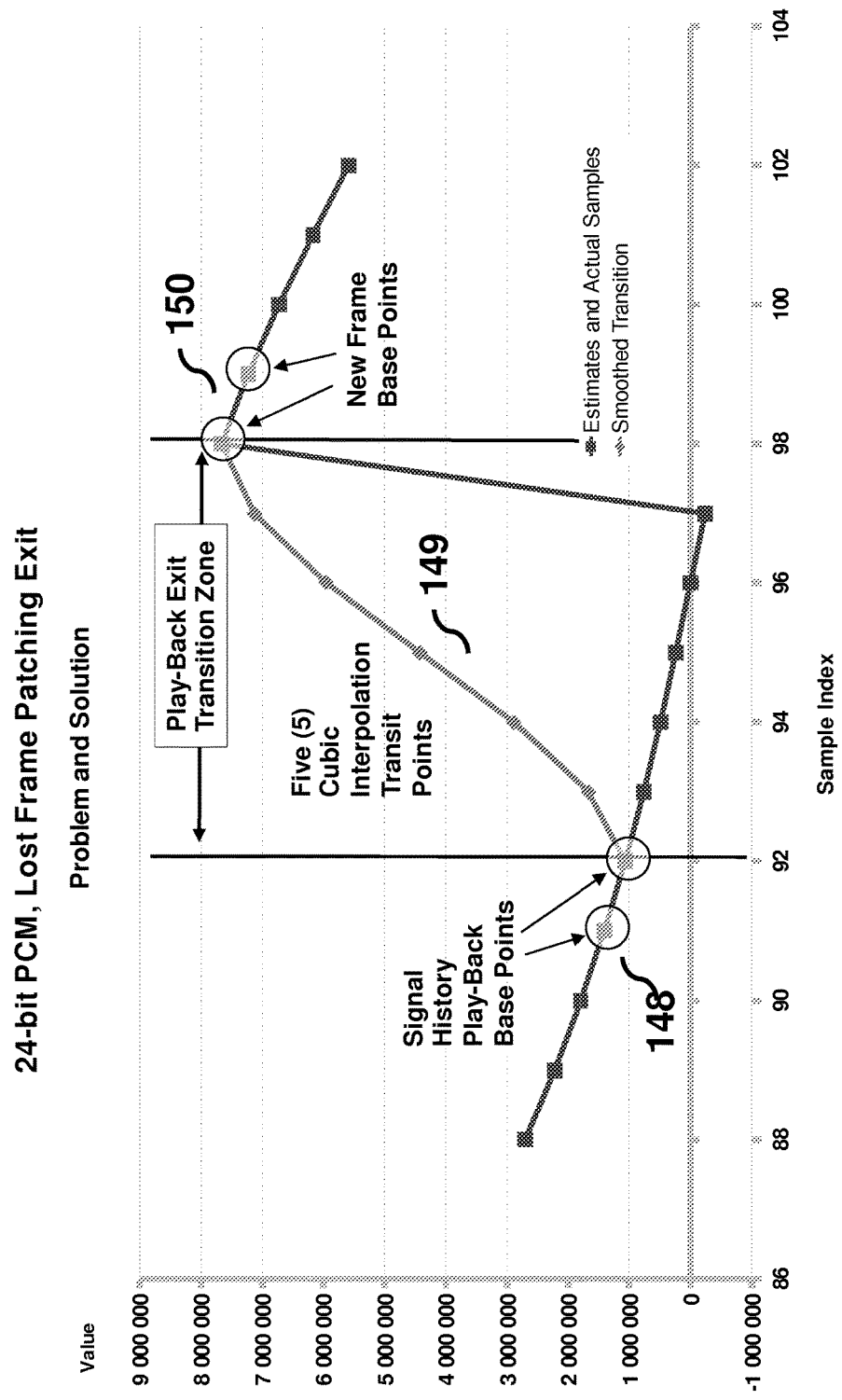

Fig. 32

Smooth Exit from the Play-Back Mode

Cubic Alignment Estimation (CAE-252) Algorithm $\zeta = \mathbf{CA}^{-1}\mathbf{Z}^T$, calculation of the five transition interpolation points, where (1)

$$\mathbf{A} = \begin{bmatrix} 0 & 0 & 0 & 1 \\ 1 & 1 & 1 & 1 \\ 343 & 49 & 7 & 1 \\ 512 & 64 & 8 & 1 \end{bmatrix}, \text{ for CAE-252}, \quad \mathbf{C} = \begin{bmatrix} 8 & 4 & 2 & 1 \\ 27 & 9 & 3 & 1 \\ 64 & 16 & 4 & 1 \\ 125 & 25 & 5 & 1 \\ 216 & 36 & 6 & 1 \end{bmatrix}, \text{ cubic coefficients matrix}$$

153 ↗

$\mathbf{Z} = [w_0 \ w_1 \ w_7 \ w_8]$, sample vector $$154 \rightarrow \mathbf{CA}^{-1} = \begin{bmatrix} -15/28 & 10/7 & 2/7 & -5/28 \\ -5/7 & 10/7 & 5/7 & -3/7 \\ -9/14 & 8/7 & 8/7 & -9/17 \\ -3/7 & 5/7 & 10/7 & -5/7 \\ -5/28 & 2/7 & 10/7 & -15/28 \end{bmatrix}$$

155
$w_2 = -15w_0/28 + 10w_1/7 + 2w_7/7 - 5w_8/28$ (6.1)
$w_3 = -5w_0/7 + 10w_1/7 + 5w_7/7 - 3w_8/7$ (6.2)
$w_4 = -9w_0/14 + 8w_1/7 + 8w_7/7 - 9w_8/14$ (6.3)
$w_5 = -3w_0/7 + 5w_1/7 + 10w_7/7 - 5w_8/28$ (6.4)
$w_6 = -5w_0/28 + 2w_1/7 + 10w_7/7 - 15w_8/28$ (6.5)

*For each point: four integer multiplications,
Four integer divisions, and three integer additions*

Error Handling

Frame Loss Management and Soft Mute Fading Algorithm

Fig. 35

Cubic Resampling Estimation (CRE-3/4) Algorithm $\zeta = CA^{-1}Z^T$, calculation of the middle cubic interpolation estimates, where $$A = \begin{bmatrix} 0 & 0 & 0 & 1 \\ 8 & 4 & 2 & 1 \\ 64 & 16 & 4 & 1 \\ 216 & 36 & 6 & 1 \end{bmatrix}, \text{ cubic interpolation matrix for CRE-3/4,}$$

$$C = \begin{bmatrix} 1 & 1 & 1 & 1 \\ 27 & 9 & 3 & 1 \\ 125 & 25 & 5 & 1 \end{bmatrix}, \text{ coefficients matrix}$$

$Z = [w_0 \; w_2 \; w_4 \; w_6]$, sample vector $$A^{-1} = \begin{bmatrix} -1/48 & 1/16 & -1/16 & 1/48 \\ 1/4 & -5/8 & 1/2 & -1/8 \\ -11/12 & 3/2 & -3/4 & 1/6 \\ 1 & 0 & 0 & 0 \end{bmatrix}$$

$$CA^{-1} = \begin{bmatrix} 5/16 & 15/16 & -5/16 & 1/16 \\ -1/16 & 9/16 & 9/16 & -1/16 \\ 1/16 & -5/16 & 15/16 & 5/16 \end{bmatrix}$$

$w_s = 5w_0/16 + 15w_2/16 - 5w_4/16 + w_6/16$    (7.1)
$w_m = -w_0/16 + 9w_2/16 + 9w_4/16 - w_6/16$    (7.2)
$w_e = w_0/16 - 5w_2/16 + 15w_4/16 + 5w_6/16$    (7.3)

*Two integer multiplications, three binary integer divisions and three integer additions - can be optimized*

(1)

Sampling Rate Doubler Apparatus and Computer
Program Product based on the
Cubic Estimation (CRE-3/4) Algorithm

PROCESSING AND ERROR CONCEALMENT OF DIGITAL SIGNALS

TECHNICAL FIELD

The invention relates to encoding and transmission of digital audio signals. In particular, the invention relates to a method, to an apparatus, to a system and a computer program for error concealment processing of digital audio signals. Moreover, although audio may be considered as a main application of the invention, the invention is also applicable with other types of digital signals, especially bandwidth limited digital signals.

BACKGROUND

With the currently well-known audio techniques, the studio-quality multi-channel digital signal is first converted to the analog form and then transferred to monitor loudspeakers with the per-channel electrical cables. A digital transmission method with electrical cables or optical fibers is also known. If the loudspeakers are passive, an additional amplifier for each loudspeaker is typically required to amplify the signal power at the transmitter and to feed the transmission cable line with enough power to drive the loudspeaker elements at the appropriate sound power level.

All these manipulations, as well as the physical analog transmission path itself, may inject several degrading effects, such as noise, interference, distortion, group delays, amplitude and phase errors, to the original signal. The cabling is also often rather clumsy and can be messy looking. With careful design of cables and their wiring layout, these effects can, at cost, be limited to some extent but seldom completely overcome. The number and bulkiness of the cables, the need for careful design and tedious installation work increase the costs as well as the required skills and time.

Cables and their connectors are further prone to mechanical faults, which are typically hard to find and fix. These problems are especially harmful in public performances when the performers and often even the audience move among the cables. Under these conditions, there exists a real hazard of harm and injury with the cabling. During artistic tours, the audio equipment is installed and uninstalled frequently to and from the varying environments, which multiplies these problems, efforts, and costs.

The use of active loudspeakers, having integrated and speaker element characteristics optimized amplifiers within them, simplifies the situation to some degree. The analog signals employed in such arrangements may be of lower power level and the more noise and interference resistant differential signaling can be readily employed. The generation of multi-channel differential signals requires, however, rather expensive, high-quality analog electronics plus costly differential cabling and connectors.

While a wireless distribution of audio signal(s) would enable dispensing with cables and connectors to a large extent, most of the currently available wireless audio distribution systems are either non-standard radio solutions or infrared solutions, typically using lossy audio compression methods thus resulting compromised audio performance. Moreover, wireless distribution is also prone to transmission errors providing a further challenge in provision of high-quality audio. They are therefore mainly used for supportive purposes, such as for rear speakers in home theaters.

SUMMARY

It is an object of the present invention to provide a high-quality approach for processing of digital signals, such as audio signals, which facilitates transmission of such signals over wireless or otherwise error-prone transmission paths.

According to a first aspect of the invention, a method for forward error concealment encoding of a digital signal data stream comprising a sequence of individual digital samples is provided. The method comprises encoding one or more of the individual digital samples according to an encoding mode selected from a number of predetermined encoding modes in accordance with a value of the respective digital sample, wherein encoding comprises determining an encoded digital sample as a combination of bits of the respective digital sample and a predetermined number of forward error concealment bits arranged into predetermined bit positions of the encoded digital sample in accordance with the selected encoding mode.

Further according the first aspect of the invention, a method for forward error concealment decoding of a digital signal data stream comprising a sequence of encoded individual digital samples, characterized in that the method comprises decoding one or more of the individual encoded samples into respective decoded digital samples according to a decoding mode selected from a number of predetermined decoding modes in accordance with a detected encoding mode of the respective encoded digital sample, wherein the encoding mode is detected on basis of the value of one or more bits of the encoded digital sample. The encoded digital samples may, for example, be encoded according to the encoding method in accordance with the first aspect of the invention.

According to a second aspect of the invention an apparatus for forward error concealment encoding of a digital signal data stream comprising a sequence of individual digital samples is provided, the apparatus comprising at least one processor and at least one memory including computer program code for one or more programs, the at least one memory and the computer program code are configured to, with the at least one processor, cause the apparatus to encode one or more of the individual digital samples according to an encoding mode selected from a number of predetermined encoding modes in accordance with a value of the respective digital sample, wherein encoding comprises determining an encoded digital sample as a combination of bits of the respective digital sample and a predetermined number of forward error concealment bits arranged into predetermined bit positions of the encoded digital sample in accordance with the selected encoding mode Further according to the second aspect of the invention an apparatus for forward error concealment decoding of a digital signal data stream comprising a sequence of encoded individual digital samples is provided, the apparatus comprising at least one processor and at least one memory including computer program code for one or more programs, the at least one memory and the computer program code are configured to, with the at least one processor, cause the apparatus to decode one or more of the individual encoded samples into respective decoded digital samples according to a decoding mode selected from a number of predetermined decoding modes in accordance with a detected encoding mode of the respective encoded digital sample, wherein the encoding mode is detected on basis of the value of one or more bits of the encoded digital sample.

According to a third aspect of the invention, a computer program is provided, the computer program comprising including one or more sequences of one or more instructions which, when executed by one or more processors, cause an apparatus to at least perform the encoding method and/or the decoding method according to the first aspect of the invention.

The computer program may be embodied on a volatile or a non-volatile computer-readable record medium, for example as a computer program product comprising at least one computer readable non-transitory medium having program code stored thereon, the program which when executed by an apparatus cause the apparatus at least to perform the operations described hereinbefore for the computer program according to the third aspect of the invention.

The exemplifying embodiments of the invention presented in this patent application are not to be interpreted to pose limitations to the applicability of the appended claims. The verb "to comprise" and its derivatives are used in this patent application as an open limitation that does not exclude the existence of also unrecited features. The features described hereinafter are mutually freely combinable unless explicitly stated otherwise.

The novel features which are considered as characteristic of the invention are set forth in particular in the appended claims. The invention itself, however, both as to its construction and its method of operation, together with additional objects and advantages thereof, will be best understood from the following detailed description of specific embodiments when read in connection with the accompanying drawings.

BRIEF DESCRIPTION OF FIGURES

In the following, some embodiments of the invention is described in more detail with reference to the exemplifying preferred embodiments implementing the 16 and 24 bit forward error concealment coding together with the different polynomial estimation methods as illustrated in the attached drawings in which:

FIG. 2 shows as feature lists the most important differences between the two preferred embodiments of the polynomial concealment method.

FIG. 3 shows as a flow chart the key operations of the cubic estimation coding in the transmitter station and in the receiver stations in accordance with the invention.

FIG. 12 shows as a matrix calculation algorithm the cubic predictive estimation method, called CPE-410, used as a part of the error concealment operation in the receiver stations of the preferred embodiment in accordance with this invention.

FIG. 13 shows as a matrix calculation algorithm the cubic interpolation alignment estimation method, called CAE-311, used as a part of the error concealment operation in the receiver stations of the preferred embodiment in accordance with this invention in the case when only the next future sample is known and is error-free.

FIG. 14 shows as a matrix calculation algorithm the cubic interpolation alignment estimation method, called CAE-212, used as a part of the error concealment operation in the receiver stations of the preferred embodiment in accordance with this invention in the case when the two nearest future samples are known and are error-free.

FIG. 31 shows as a signal graph the details of the smooth exit from the circular signal history play-back to normal frame reception operation of the receiver stations of the preferred embodiment in accordance with this invention.

FIG. 32 shows as a matrix calculation algorithm of the cubic five point interpolation alignment estimation method used for the amplitude and phase alignment during the transition from circular play-back to normal frame reception in the receiver stations of the preferred embodiment in accordance with this invention.

FIG. 35 shows as a matrix calculation algorithm of the cubic five point interpolation alignment estimation method used for the re-sampling between the successive samples of the audio stream in the transmitter station of the preferred embodiment in accordance with this invention.

Figure 1:
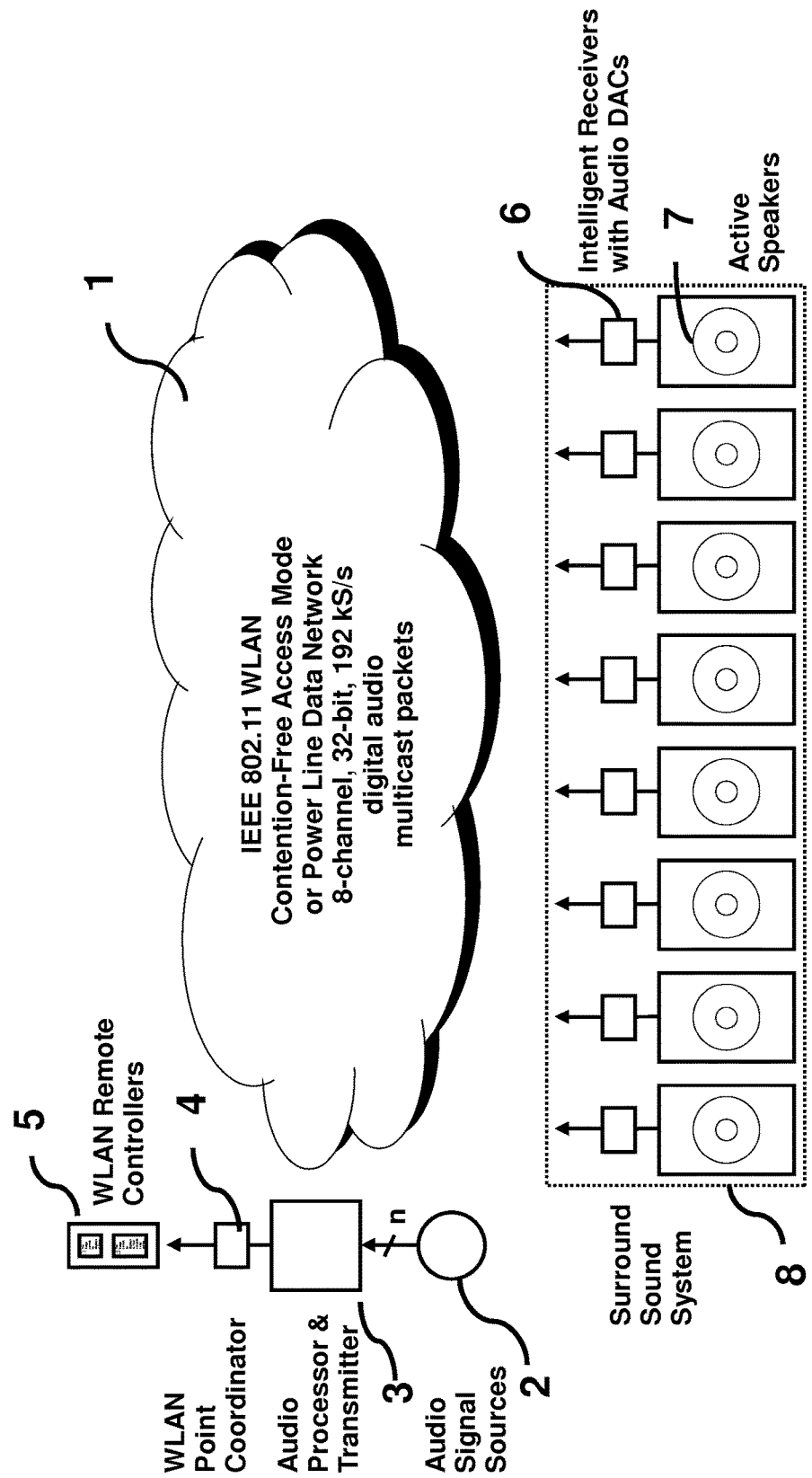
FIG. 1 shows as a block diagram of the preferred embodiment of the invention as the general system configuration diagram.

In this document, the following terms, with reference to the Figures, will be used in connection with embodiments of the invention.

1 Wireless Local Area Network, WLAN, IEEE 802.11 Packet Data Network or power line communication network, such as the HomePlug/AV
2 Audio sources (n units)
3 Digital Audio Processing and Transmitting Station
4 WLAN Point Coordinator
5 Remote Control Terminal(s)
6 Receiver Stations, one or more per channel
7 Active loudspeaker(s)
8 Surround Sound System
9 Preferred Embodiment: Cubic Estimation Concealment Method
10 Preferred Embodiment: Polynomial Estimation with Bit Healing
11 Multichannel Digital Audio Sample Stream
12 Dual Mode Encoding
13 Optional Encryption
14 Crypto key
15 WLAN Frame Emission
16 WLAN Frame Capture
17 Frame Loss Test
18 Signal History Play-Back
19 Frame Loss Management
20 Dual Mode Decoding
21 Bit Errors Test
22 Sample Estimation
23 Channel Formatting
24 Signal History Recording
25 Audio Feed to Output via Digital-to-Analog Converter (DAC)
26 Dual Mode Nibble based Encoding
27 Dual Mode Nibble based Decoding
28 Bit Healing
29 Sample Value Test for 16/24-bit modes
30 Generic 24-bit Sample Format
31 16-bit Mode Encoding
32 24-bit Mode Encoding
33 Word Format at Reception
34 Mode Detection Test
35 Mode Indicator Octet
36 24-bit Mode Test
37 16-bit Mode Test
38 24-bit Mode Decoding
39 16-bit Mode Decoding
40 Cubic Estimations
41 Decoded 24-bit Mode Sample
42 Zero Mask
43 Decoded 16-bit Mode Sample
44 Octet Rearrangements
45 Sample Sign Extension
46 Bit Errors Indication
47 Frame Error Indication
48 Received Sample Stream
49 Error Concealment Control
50 Error Statistics
51 Concealment Selection
52 Results Stream Selection
53 Cubic Estimator Bank
54 Adaptive Slew Rate Limiter
55 Resynchronization after History Play-Back
56 Programmed Attenuator
57 Output Sample Stream
58 Cubic Predictive Estimation (CPE)
59 Cubic Alignment Estimation (CAE)
60 Received Sample containing errors
61 Received Sample concealed using Cubic Estimations
62 Next Sample Error Test
63 Second to Next Sample Error Test
64 Four Point Cubic Extrapolation
65 Three plus One Point Cubic Interpolation
66 Two plus Two Point Cubic Interpolation
67 Error Statistics Update
68 Cubic Extrapolation Matrix
69 Cubic Coefficients Vector 70 Cubic Sample Vector
71 Inversion of Cubic Extrapolation Matrix
72 Matrix Product of Coefficients Vector and Inverted Extrapolation Matrix
73 Extrapolated Sample
74 Cubic 3+1 Point Interpolation Matrix
75 Inversion of Cubic 3+1 Point Interpolation Matrix
76 Matrix Product of Coefficients Vector and Inverted 3+1 Point Interpolation Matrix
77 Interpolated Sample based on 3+1 Points
78 Cubic 2+2 Point Interpolation Matrix
79 Inversion of Cubic 2+2 Point Interpolation Matrix
80 Matrix Product of Coefficients Vector and Inverted 2+2 Point Interpolation Matrix
81 Interpolated Sample based on 2+2 Points
82 24-bit Nibble Mode Encoding
83 Top Nibble Check Nibble Generation
84 Combined Lower Nibbles Check Nibble Generation
85 16-bit Mode Lower Byte Test
86 16-bit Mode Lower Byte Test Result
87 16-bit Mode Errors Test
88 16-bit Mode Error Position Indication
89 24-bit Nibble Mode Decoding
90 Bit Healing in 16-bit Mode
91 24-bit Nibble Mode Lower Nibbles Error Check Result
92 24-bit Nibble Mode Lower Nibbles Error Check
93 24-bit Nibble Mode Top Nibble Error Check
94 24-bit Nibble Mode Top Nibble Error Check Result
95 Top Byte Registration in 24-bit Nibble Mode, No Errors
96 Middle Byte Registration in 24-bit Nibble Mode, No Errors
97 Low Byte Registration in 24-bit Nibble Mode, No Errors
98 24-bit Nibble Mode Error Check with Error Position Indication
99 24-bit Nibble Mode Decoding Result with or without Errors
100 Bit Healing in 24-bit Nibble Mode
101 Registration of 24-bit Nibble Mode Bit Healing Results
102 Polynomial Estimators Bank and Bit Healing
103 Polynomial Estimation and Bit Healing Algorithm
104 Extra Samples Collection for Interpolative Polynomial Estimation
105 Polynomial Selection based on available Error-Free or Concealed Samples
106 Estimate Calculation with the selected Polynomial
107 Bit Healing based on the Error Position Indicator Mask and Bit Flipping
108 Generic Seventh Order Polynomial Estimation Formula
109 Coefficients Alternatives (16) for different Error Location Patterns
110 Bit Healing Algorithm
111 Bit Healing Mode Selection Test
112 16-bit Byte Mode Bit Healing
113 24-bit Nibble Mode Bit Healing
114 16-bit Byte Mode Bit Healing Algorithm
115 High Byte Variant(s) Generation
116 High Byte Variant(s) Comparisons against Estimate
117 Selection of the Winning High Byte Variant Value
118 Low Byte Variant(s) Generation
119 Low Byte Variant(s) Comparisons against Estimate
120 Selection of the Winning Low Byte Variant Value
121 24-bit Nibble Mode Bit Healing Algorithm
122 Top Nibble Variant(s) Generation
123 Top Nibble Variant(s) Comparisons against Estimate
124 Selection of the Winning Top Nibble Variant Value
125 Lower Nibbles Variant(s) Generation
126 Lower Nibbles Variant(s) Comparisons against Estimate
127 Selection of the Winning Lower Nibble Variants Values
128 Sample Estimate after Concealment and Slew Rate Limitation
129 Adaptive Slew Rate Zone
130 Absolute Slew Rate Zone
131 Currently Allowed Value Range
132 Input Channel Selectors
133 Input Channel Attenuators
134 Summation Block
135 Signal History Q-Buffer
136 Signal Output Driver
137 Channel Formatting Controller
138 Signal History Storage Block
139 Signal History Fill-In Pointer
140 Previous Negative-to-Positive Zero-Crossing Point
141 Latest Negative-to-Positive Zero-Crossing Point
142 Wrap-Around Pointer
143 Q-Buffer Mirror Zone
144 Lost Frame
145 Patched Frame
146 Discontinuity Point
147 Alignment Zone
148 Play-Back Base Points
149 New Frame Base Points
150 Cubic Interpolation Transit Points
151 Cubic Transition Points Interpolation Matrix
152 Coefficients Matrix for 5 Point Cubic Interpolation
153 Signal History and New Frame Base Points Vector
154 Matrix Product of 5 Point Coefficients Vector and Inverted 2+2 Point Interpolation Matrix
155 Cubic Transition Point Estimates
156 Error Handling Algorithm
157 Error Limit value Check
158 Soft Mute Fading Invocation Algorithm
159 Soft Mute Fading Limit Check
160 Soft Mute Fading Mode Exit Algorithm
161 Exit Soft Mute Fading Mode Check
162 Cubic Re-Sampling Interpolation Matrix
163 Coefficients Matrix for Cubic Re-Sampling
164 Re-Sampling Base Points Vector
165 Inversion of the Re-Sampling Interpolation Matrix
166 Matrix Product of the Coefficients Vector and the Inverted Re-Sampling Interpolation Matrix
167 Cubic Re-Sampled Point Estimates
168 Sampling Rate Doubler Board
169 Data Stream Input port
170 Data Stream Output Port
171 Data Stream Re-Sampling Microcontroller
200 Apparatus
210 Processor
220 Memory
230 Communication interface
240 User interface
250 Computer program
260 Direct Memory Access resource(s)
270 Clock generator(s) and Programmable Phase-Locked Loop(s)
280 Power supply management
290 Interrupt controller
300 (Digital) input resource(s)
310 Analog-to-Digital converter(s)

320 (Digital) output resource(s)
330 Digital-to-Analog converter(s)
400 Apparatus

DETAILED DESCRIPTION

Embodiments of this invention facilitate high-quality transfer of digital information e.g. using multicasting from a central transmitter station to individual receivers stations, e.g. to transfer digital audio signal from a central transmitter to one or more loudspeaker receiver stations in the studio-quality digital format. The physical transfer of information may employ e.g. electromagnetic radio waves of the wireless local area networks (WLAN) or through power line wiring without dedicated signal cables using standardized, high-capacity WLAN or power line communication network components, as shown in FIG. 1.

The digital signal may be converted to the analog form only at the receiver station for further processing of the signal, e.g. the digital signal may be converted to the analog form at an active loudspeaker unit and fed locally to the optimized electronic low-pass, band-pass and high-pass filters, amplifiers, and finally to the loudspeaker elements. This improves the overall sound quality significantly which is one of the major advantages of this technique. Because of the mass-produced commercial WLAN and power line communication components can be employed and only a small number of additional standard integrated circuits is needed, the cost of the system can be kept very reasonable which is another significant advantage of this technique.

As any transmission link is susceptible to many types of disturbances, it is beneficial to device a method to cope with them the best possible way. With streaming digital audio the bit related errors as well as the lost audio frames are preferably concealed in such a way that the listener of the signal does not notice these errors.

Hence, it is an aim of this invention to conceal, with low-latency, the wireless transmission related errors of digital signals, e.g. uncompressed, bandwidth limited, periodic digital signals, such as recorded and live digital audio. To achieve the necessary low latency, the well-known and highly efficient block based forward error correction codes and retransmission techniques cannot be used.

For these reasons, embodiments of this invention are based on novel, sample level multi-mode forward error concealment coding and decoding, frame level error concealment processing or a combination of sample and frame level error concealment estimation methods where an aim is to conceal the relatively rare bit errors and/or the even more rare but very serious frame loss errors to such a degree that their existence cannot be noticed by the listeners. This can be achieved, for example, with the special, lossless dual mode forward error concealment coding method and the related error detection, error bit position indication, possibly complemented with frame level error concealment methods according to embodiments of this invention.

The multi-mode encoding, which may be embodied e.g. as a dual mode encoding, may provide separate coding modes for samples of different amplitude levels of a digital signal, e.g. separate and different coding modes for low volume audio signal samples and high volume audio signal samples. Such approach serves to achieve a proper error concealment for both cases and the encoding is done in such a way that the receivers can explicitly detect the coding mode on the per received sample basis. Error-free samples can therefore be quickly decoded and the samples with transmission related bit errors in them are concealed with the signal characteristics optimized polynomial extrapolation and interpolation estimation methods, bit healing algorithms, and slew rate limiting methods according to embodiments of this invention.

The concealment in accordance with embodiments of this invention also includes a second major approach to conceal the loss of a complete audio signal frame comprising a sequence of audio signal samples. This is done by applying the cyclic signal play-back of the latest waveform stored in the special audio signal history buffer. As the third and final part an approach for returning from the signal history play-back mode to the normal frame reception is provided. This approach is based on the multipoint polynomial interpolation of the mode transfer to make it inaudible. For the total loss of frame traffic, an intelligent adaptive fading method is also applied.

The error concealment according to an embodiment of the invention employs firstly a dynamically varied, dual mode encoding technique in the transmitter and correspondingly two decoding schemes in the receivers to separately handle the low-volume and the high-volume audio signals.

Secondly for the bit level error concealment an optimized set of polynomials are provided, as summarized in FIG. 2.

In the first most preferred embodiment the third-order, cubic polynomials are used in the extrapolative and interpolative estimation roles. This embodiment offers very low latency and relatively good concealment, good enough for the 16-bit audio.

In another most preferred embodiment, polynomials from third-order to seventh-order form the foundation for the extrapolation and interpolation estimation methods. This embodiment has a little more latency but it is significantly more accurate. The polynomials are based on four relevant preceding samples and up to four error-free following samples. We call the technique of this preferred embodiment the polynomial estimation bit error concealment.

To further improve the accuracy of the concealment another optional preferred embodiment adds the bit healing functionality. In it the positions of the erroneous bits are indicated and the bits in error are healed by flipping their values and using the generated variants closest to the polynomial estimate in an iterative process.

To further limit the possibility of any audible artifacts, an optional, adaptive slew rate limitation technique may be applied to the estimation results.

For the lost frames, the third, complementary technique, based on the analysis of latest signal history and the low-to-high zero-crossings of the recorded signal history may be used. In this approach, the data of the lost frame is replaced by the cyclic repetition of the previously stored history sample data. The cycle starts from the corresponding, calculated phase point relative to that expected from the start of the lost frame.

The fourth technique that may be employed together with the third one is the alignment of the end of the lost frame replacement data sequence to the beginning of the next successfully received frame. This is achieved by modifying a few samples in the end of the lost frame replacement signal history data to create a smooth transfer joint.

For the long-term loss of audio frames, an adaptive fading approach, also referred to as smooth muting, can finally be used.

Figure 4:
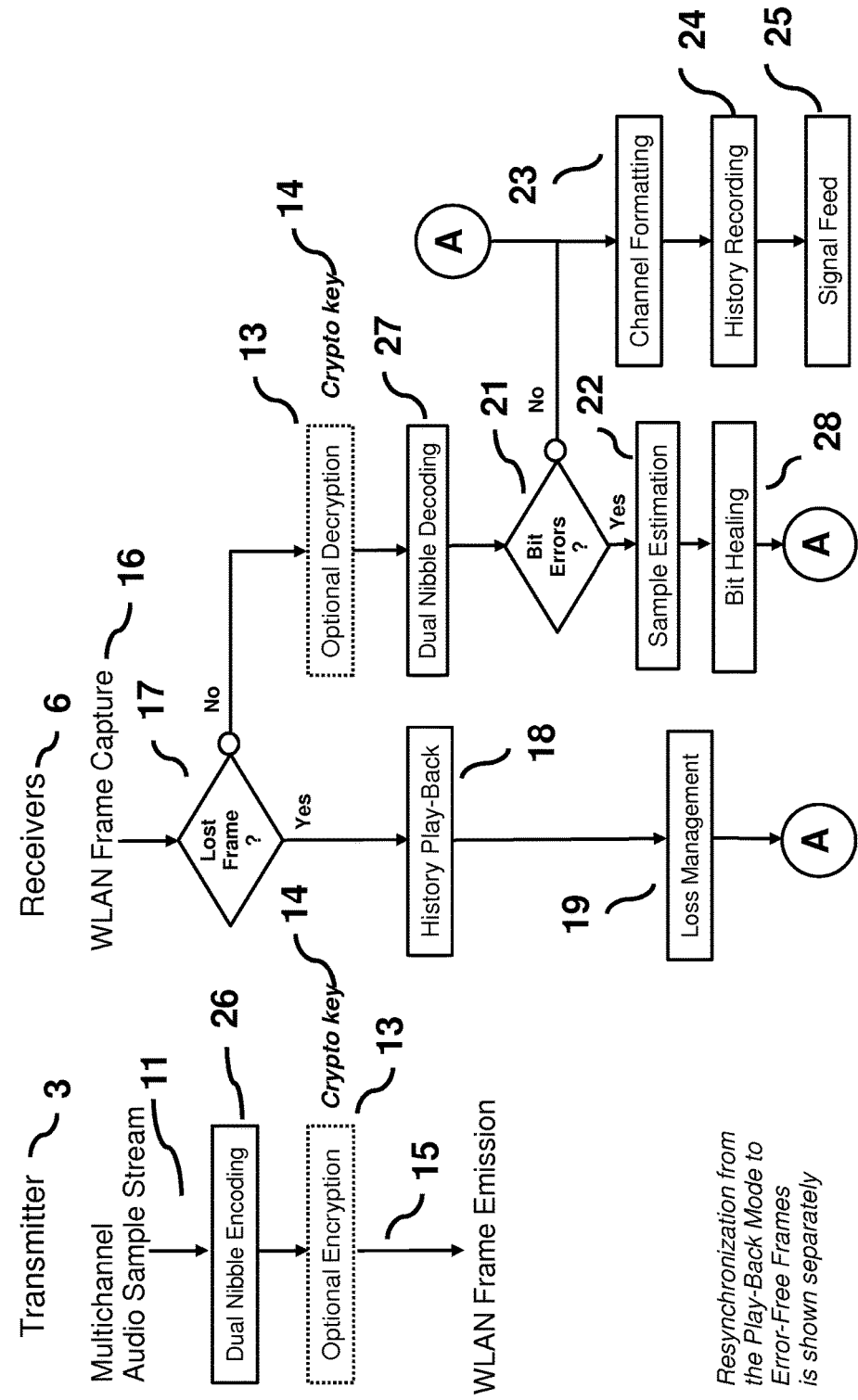
FIG. 4 shows as a flow chart the key operations of the polynomial estimation coding with bit healing in the transmitter station and in the receiver stations in accordance with the invention.

These concealment techniques are integrated together in each receiver station e.g. as shown in FIGS. 3 and 4. This figure also shows the encoding, encrypting, decrypting, and decoding functions and their relationships.

In accordance with the previously introduced preferred embodiments, which are used as the illustrative example with the detailed descriptions, the dual mode 16 and 24 bit coding for digital audio is used as an example of multi-mode coding for forward error concealment, together with the third order, cubic polynomials or alternatively with polynomials of orders from third to seventh.

With this preferred embodiment we also use the sampling rate of 192 kHz and we assume the full audio bandwidth from 20 Hz up to 20 kHz. These choices, typical for studio-quality audio, are reflected in the selection of some parameters in the preferred embodiments. In the detailed descriptions these parameters include the history buffer size, the slew rate limitation criteria, and the number of interpolated sample points when returning from the play-back mode. These preferred embodiments of the examples do, however, not limit the application of the general ideas and the inventions of this patent to any other related embodiments equally covered by this patent. As an example in this regard, a different sampling rate and/or a different audio bandwidth may be employed without departing from the scope of the invention.

With the help of the invention significant benefits can be obtained. The benefits are especially in the areas of signal quality, concealment efficiency, low latency, system configuration flexibility and system cost savings.

With the per-loudspeaker multicast message frame reception of the studio-quality digital audio supported by the comprehensive and efficient error concealment approaches in accordance of embodiments of this invention, all the error factors associated to the traditional loudspeaker signal path can be avoided. Performing the digital-to-analog conversion as late as possible, e.g. just in the active loudspeaker unit, provides high sound quality by localizing the propagation path of the analog signal on the fixed and optimized active loudspeaker circuitry in accordance with one embodiment of the invention.

With the dynamic, dual mode error concealment coding the audio specific concealment can be optimized separately for low volume and high volume signals.

With the third order polynomial predictive estimation, also called cubic extrapolation estimation, the single bit and the multiple bit transmission errors can be concealed in an unified way. Using signal slew rate limitation in the time domain signal sample stream, the concealment related artifacts can be attenuated to an inaudible level. Since the estimation is based on the history data points only, it does not introduce any additional latency to the transmission. If the one or two sample latency is acceptable, the cubic interpolation versions can be used for improved performance.

With the preferred embodiment of polynomial estimation using four samples preceding the faulty one and up to four error-free samples following it, a very accurate concealment is possible at the cost of the latency of the four additional sample periods. This preferred embodiment is suitable for the accurate concealment of genuine 24-bit audio streams.

Using the low-to-high zero-crossing detection in receivers' output channel buffers enables concealing the lost frames by a signal history buffer play-back method in which the start of play-back is aligned to match with the phase of the channel signal at the beginning of the lost frame implied by the end of the last received frame. The play-back then continues on the circular, wrap-around repetition of the last full signal cycle that was stored. The zero-crossing detection should be implemented using crossing suitable hysteresis to eliminate the effects of the audio signal noise, When a frame is again captured after the lost frames, a smooth transition from the play-back mode of operation to the normal frame reception mode of operation may be performed. This is accomplished with a cubic resynchronization algorithm which modifies the last few sample points of the play-back to build a smoothed joint to the beginning of the newly received frame.

Yet another application for the cubic interpolation is the re-sampling of the signal data stream. In a most preferred embodiment in accordance with an embodiment of the invention the sampling rate is doubled by inserting estimated new samples between all the adjacent sample pairs with cubic interpolation as described in detail later on. Higher order polynomials can, of course, be used to increase the re-sampling accuracy.

System

As illustrated by the system diagram in FIG. 1, one preferred embodiment of the system in accordance with this invention comprises of one or a plurality of signal sources 2, which may be either digital or an analog, including also the possibility for direct computer connections e.g. via USB, I2S, or Ethernet interfaces. The sources 2 are connected to the transmitter 3, which is further connected to a WLAN point coordinator 4, which may include MIMO antenna arrangements for improved wireless transmission. The transmitter 3 and the WLAN point coordinator 4 are typically commanded by one or more remote controllers 5 or by wired or wireless computer links. The signal from the WLAN point coordinator 4 is broadcast via the WLAN network 1. The broadcasting may performed, for example, using contention-free access mode of the WLAN network 1 in the form of isochronous multicast messages to the receivers 6 of the multi-channel (e.g., surround sound) system 8, consisting of several loudspeakers 7. In other words the signal data from sources 2 is transformed into digital data packets by elements 3 and 4 and transferred to the receiver stations as standard multicast WLAN digital data, for example in a stream of isochronous data packets using the contention-free access mode. In other preferred embodiments the power line data communication links, such as the HomePlug AV, are used instead of WLAN.

Dual Mode Coding based, Audio Specific, Forward Error Concealment

FIG. 2 shows as a feature list comparison the relative benefits of the two preferred embodiments of the polynomial concealment method, the cubic estimation 9 and the polynomial estimation with bit healing 10. The key benefits of the cubic estimation are the very low latency and very fast operating speed while the key benefits of the polynomial estimation with bit healing are the robustness even under severe bit error rate conditions and its accuracy of concealment.

FIG. 3 shows as a flow chart the principle of the dual mode coding and the related cubic methods with the preferred embodiment in accordance with this invention. The transmitter station 3 receives the isochronous audio sample data streams 11 from the audio sources 2 via the appropriate channel selection and adaptation interfaces that can decompresses and re-sample them if needed. The selected uncompressed multichannel digital audio data stream then enters the dual mode forward error concealment encoding block 12 which does the per-sample encoding. In the preferred embodiment the two modes are of 16-bit or 24-bit which are the commonly used digital audio sample resolutions. These resolutions are well suited to be processed with modern 32-bit microcontrollers where the remaining eight bits can be used for forward error concealment coding purposes. The same basic principle is, obviously, applicable to other combinations of two resolutions as well. Next to the encoding, the optional encryption 13 with the preset transmission crypto key 14 may or may not be done depending on the requirements of the implementation. The main aim of the crypto coding is to hide the audio stream to be broadcasted from third party receivers.

In one of the most preferred embodiments the encoded and optionally encrypted isochronous audio data stream 15 is then directed to the IEEE 802.11n standard compliant, 5 GHz ISM band compatible MIMO WLAN using contention-free multicast frames of dynamically optimized size and pre-set beacon interval. All the active WLAN receivers 6, associated with the multi-channel multicast signal receivers group, can capture 16 all the transmitted audio data frames, either error-free or with one or more bit errors in the received samples. Only when there is severe electromagnetic interference, the sent frames may be lost. For this rare, but serious situation, the lost frame concealment and an intelligent fading and anti-fading procedure are developed as parts of this invention.

Figure 26:
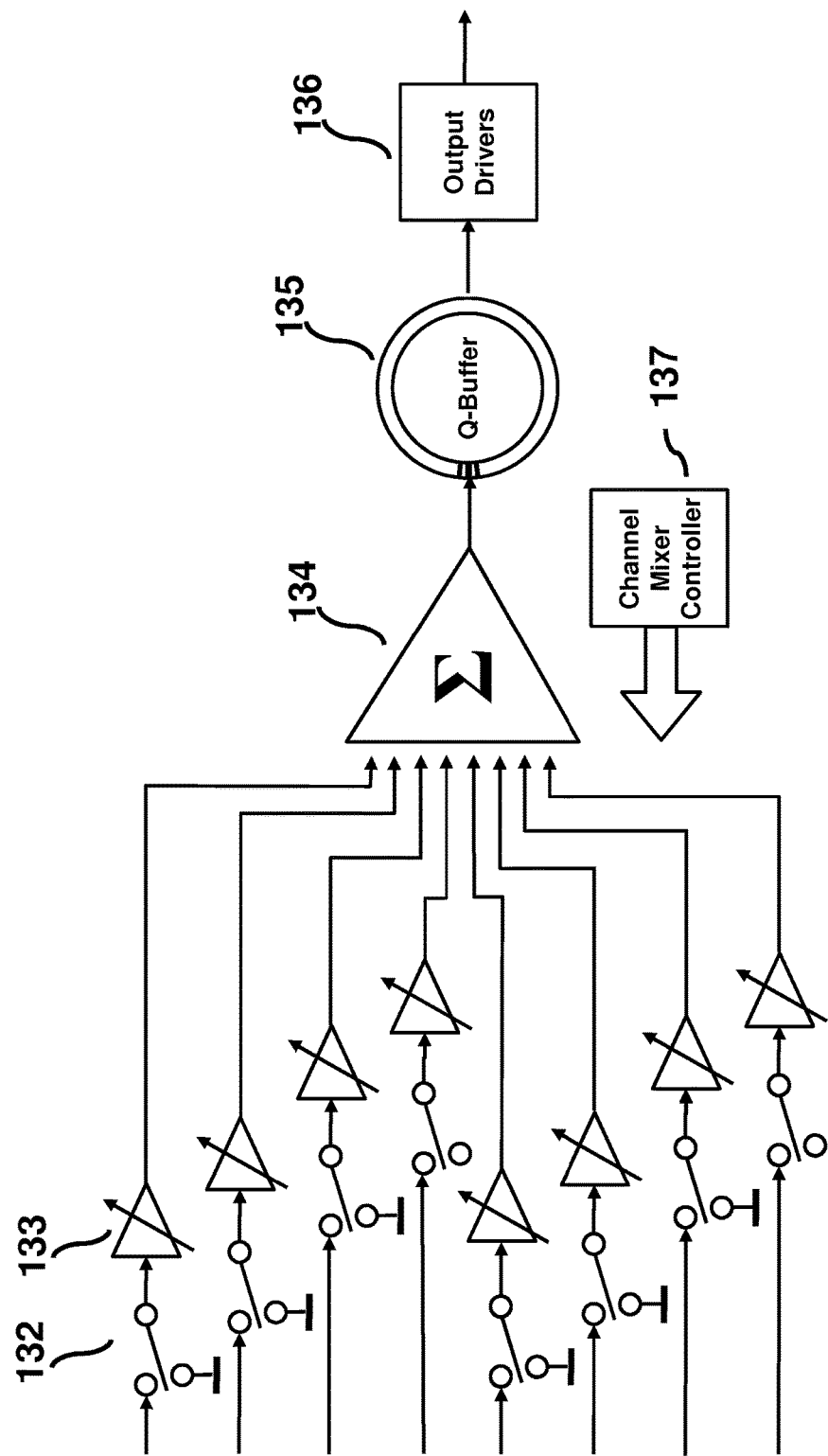
FIG. 26 shows as a block diagram the dynamic channel formatting method, called DCF, used in the receiver stations of the preferred embodiment in accordance with this invention.

After the frame capture 16, the individual receivers autonomously perform the lost frame test 17. Depending on the result of this test, the concealment algorithm then branches either to the signal history play-back 18 based, lost frame error concealment branch or to the dual mode decoding 20 branch. In the lost frame concealment branch the pre-recorded decoded signal history is played back 18 from a memory buffer phase aligned with the frame loss event. The frame loss management block 19 takes care of the loss counters and statistics updating as well as the fading related operations when they are needed. In the dual mode decoding branch the optional decryption 13 using reception crypto key 14 is followed by the actual dual mode decoding 20. After it is done, the existence of one or more bit errors in the decoded sample is tested 21. If bit errors are detected, the sample estimation block 22 updates the error statistics and performs the bit errors concealment using the most appropriate polynomial sample estimation method as described in detail later. In one of the most preferred embodiments in accordance with this invention, the third-order, cubic polynomials are used because they offer superior concealment result as compared to linear estimation but are still very fast computationally. When bit errors are concealed what has not been present, the procedure continues with channel formatting 23. The channel formatting block 23 generates the final digital audio output signal by combining the received signals of all received channels as shown in FIG. 26. After the channel formatting the resulting final sample data is recorded 24 to the audio signal history buffer for the eventual play-back and also fed 25 to the loudspeaker unit that converts the electrical signal to acoustic waves. The final signal can, of course, be directed to any audio recording device as well.

Figure 21:
FIG. 21 shows as a formula and a coefficients table the calculation method for the sixteen variations of the polynomial estimation method in the receiver stations of the preferred embodiment in accordance with this invention.

FIG. 4 shows as a flow chart the principle of the dual nibble mode coding and the related polynomial estimation with bit healing concealment method of another preferred embodiment in accordance with this invention. The overall operation is equivalent with the first preferred embodiment described in FIG. 3 with the following modifications. In the nibble based dual mode decoding branch the optional decryption 13 using reception crypto key 14 is followed by the actual nibble based dual mode decoding 27. After it is done, the existence of one or more bit errors in the decoded sample is tested 21. If bit errors are detected, the sample estimation block 22 updates the error statistics and performs the polynomial bit errors concealment using the most appropriate polynomial sample estimation method out of the available sixteen as described in detail later. In this most preferred embodiment in accordance with this invention, from third-order up to seventh-order polynomials are used because they offer superior concealment result as compared to linear or cubic estimation but are still quite fast computationally. The actual degree of the polynomial is determined by the pattern of error-free samples following the erroneous one as shown in FIG. 21 and explained with it. The polynomial concealment can still be improved considerably by the optional bit healing method 28 based on bit flipping guided by the error position indicator masks generated by the decoding algorithm, see FIG. 17 90 and FIG. 18 100 and FIGS. 22-24.

Figure 5:
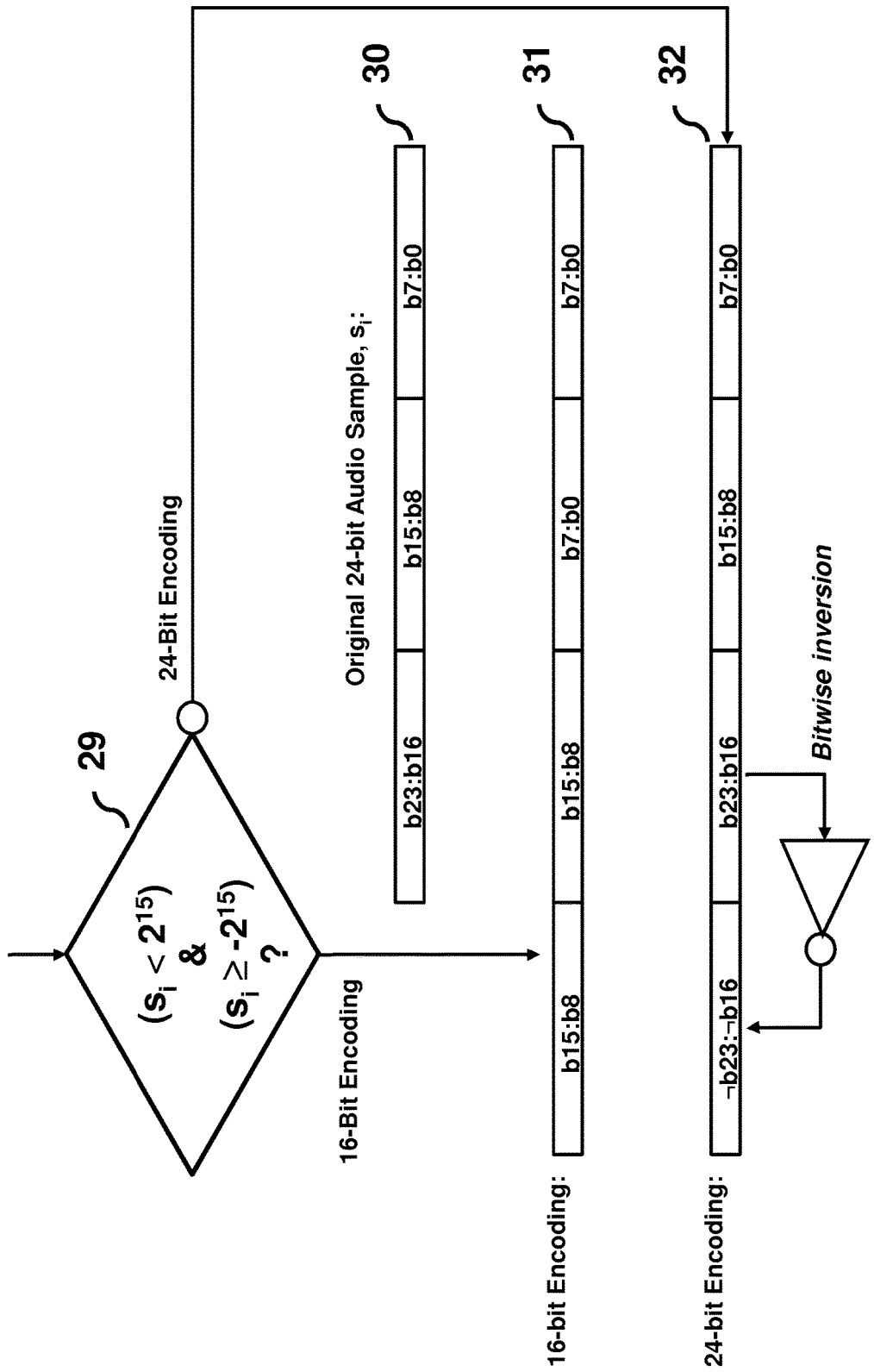
FIG. 5 shows as a flow chart the operation of the dual mode cubic forward error concealment encoding method in the transmitter station of the preferred embodiment in accordance with this invention.

FIG. 5 illustrates the cubic dual mode encoding 9 used with one of the most preferred embodiment in accordance with this invention. In this embodiment the 24-bit samples of the incoming uncompressed digital audio stream are first tested for their magnitude 29. If the sample 30 can be presented with 16 bits, the 16-bit encoding mode 31 is selected. Otherwise the 24-bit mode 32 is used. The details of the encoding can be seen in FIG. 5.

Figure 6:
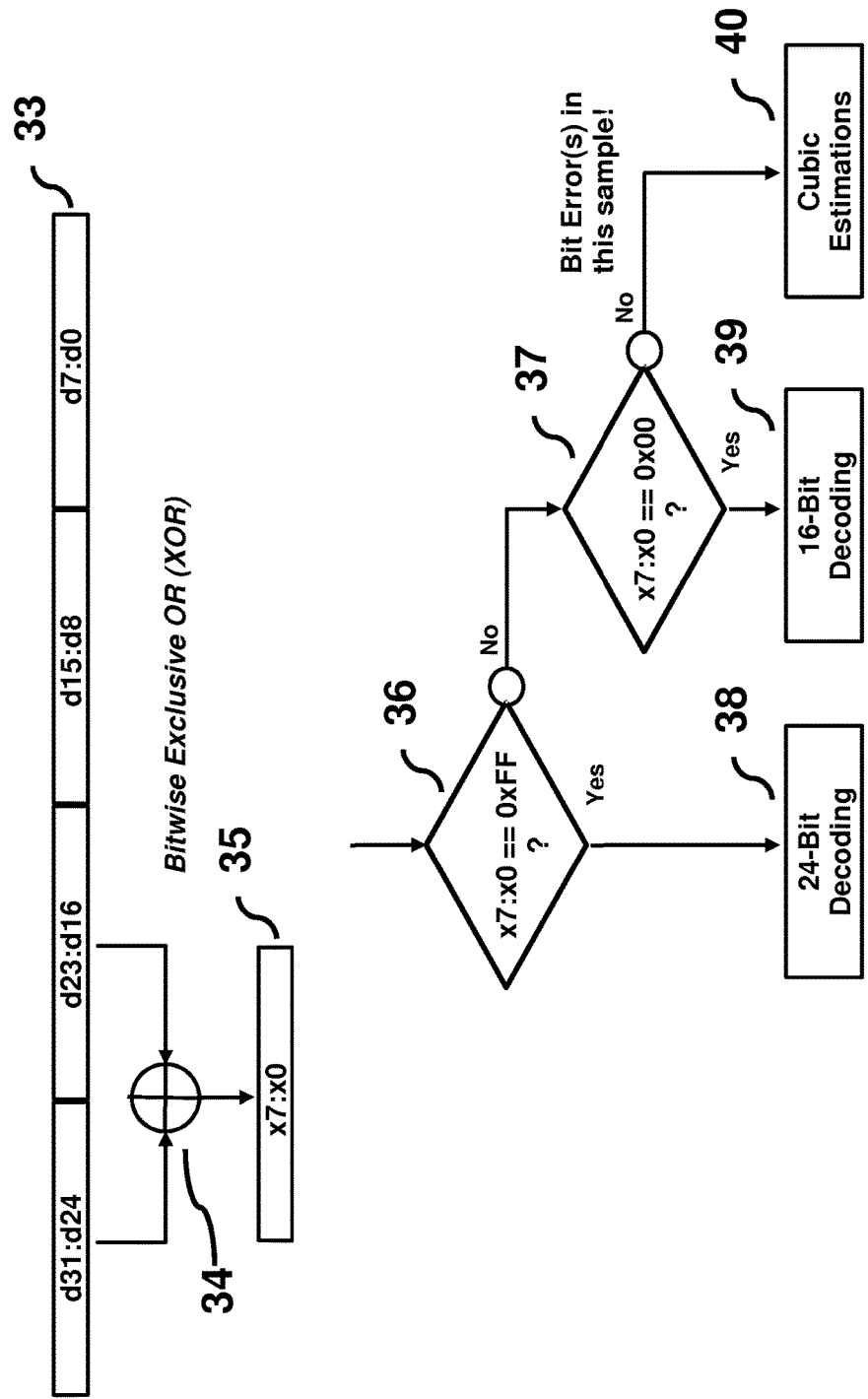
FIG. 6 shows as a flow chart the operation of the dual mode cubic forward error concealment decoding as well as estimation methods in the receiver stations of the preferred embodiment in accordance with this invention.

FIG. 6 shows as a flow chart the cubic dual mode decoding and bit errors detection taking place in parallel in all receiver stations. The two highest order data octets [d31:d24] and [d23:d16] of the received 32-bit data word 33 in one of the most preferred embodiment in accordance with this invention are first tested using e.g. a bitwise exclusive-or operation between them. Depending on the result of the bitwise exclusive-or operation 35, the 24-bit decoding 38, 16-bit decoding 39 or cubic estimation 40 is performed as determined by tests 36 and 37. The details of these three alternatives are shown in FIGS. 7-8 and 11-14. They are described in more detail in the following with references to these Figures.

Figure 7:
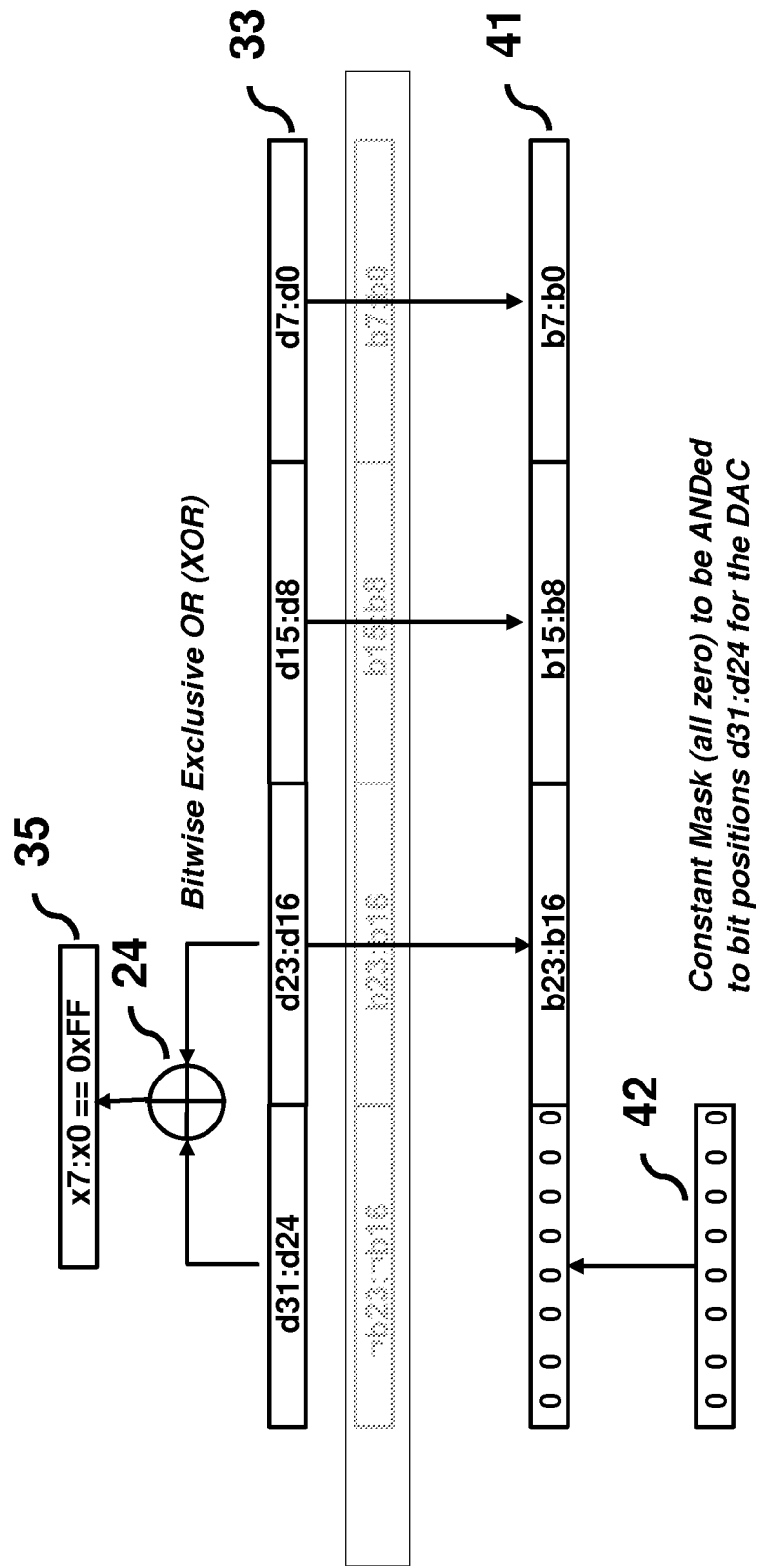
FIG. 7 shows as a flow chart the operation of the cubic 24-bit forward error concealment decoding method in the receiver stations of the preferred embodiment in accordance with this invention.

FIG. 7 shows the details of the 24-bit mode cubic decoding when no errors are present. In the 24-bit decoding, in one of the most preferred embodiment in accordance with this invention, the sample data word 41 is generated from the received data word 33 by simply forcing its bits [d31:d24] to zero e.g. by applying the bitwise AND-operation with the mask octet 42 to it. The 24-bit decoding cannot detect bit errors in the two less significant octets but their significance is typically so small that they are not audible especially when high sampling rates are used. The slew rate limitation, with its currently allowed value range, can further be used to ensure the minimization of the audible effects of any residual bit errors.

Figure 8:
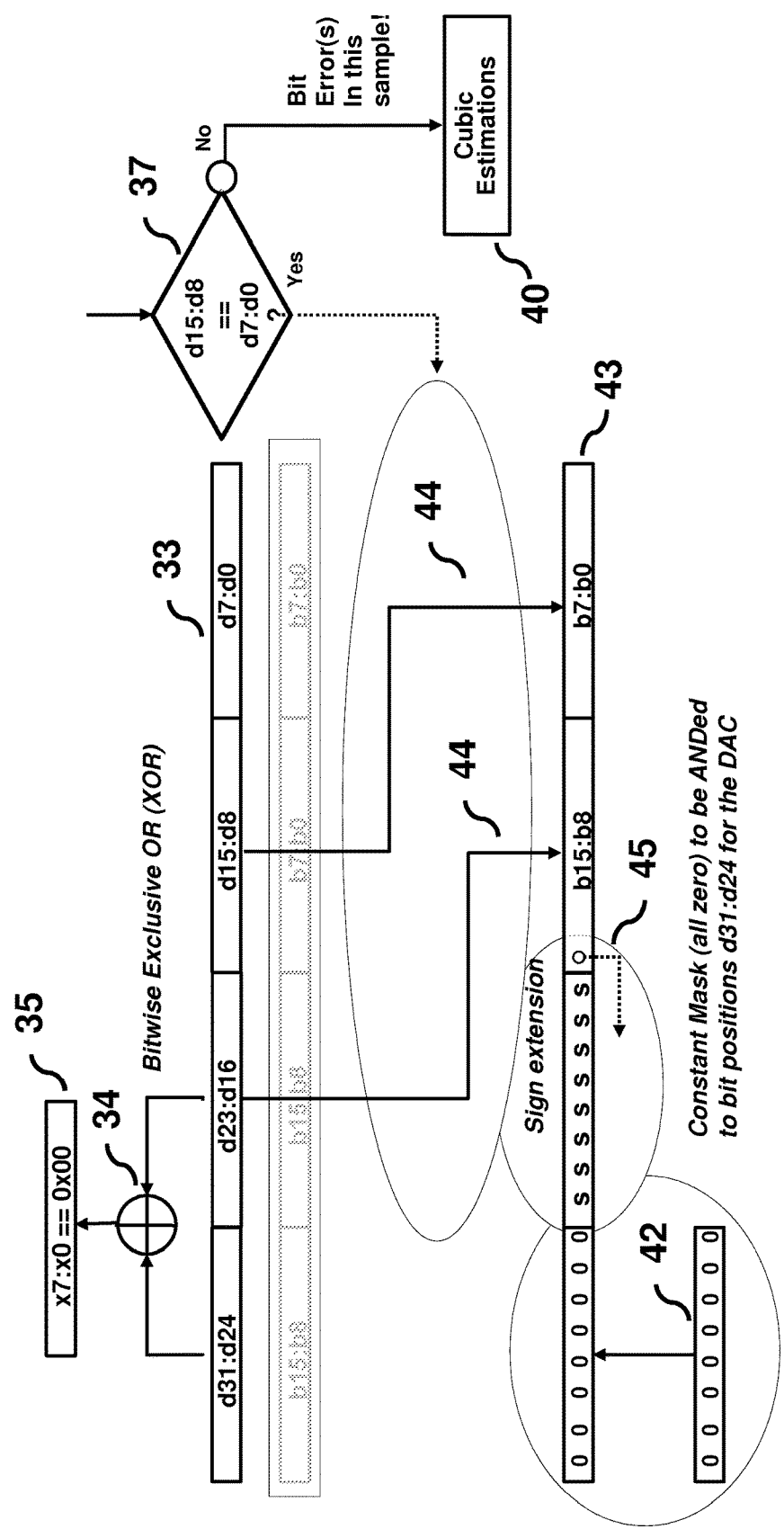
FIG. 8 shows as a flow chart the operation of the cubic 16-bit forward error concealment decoding method in the receiver stations of the preferred embodiment in accordance with this invention.

FIG. 8 shows the details of the 16-bit mode cubic decoding. In the 16-bit decoding, in one of the most preferred embodiment in accordance with this invention, the sample data word 43 is generated from the received data word 33 by shifting it right by eight bit positions 44, extending the 16-bit mode sign bit 45 to the whole word, and by forcing its bits [d31:d24] to zero e.g. by applying the bitwise AND-operation with the mask octet 42 to it.

Figure 9:
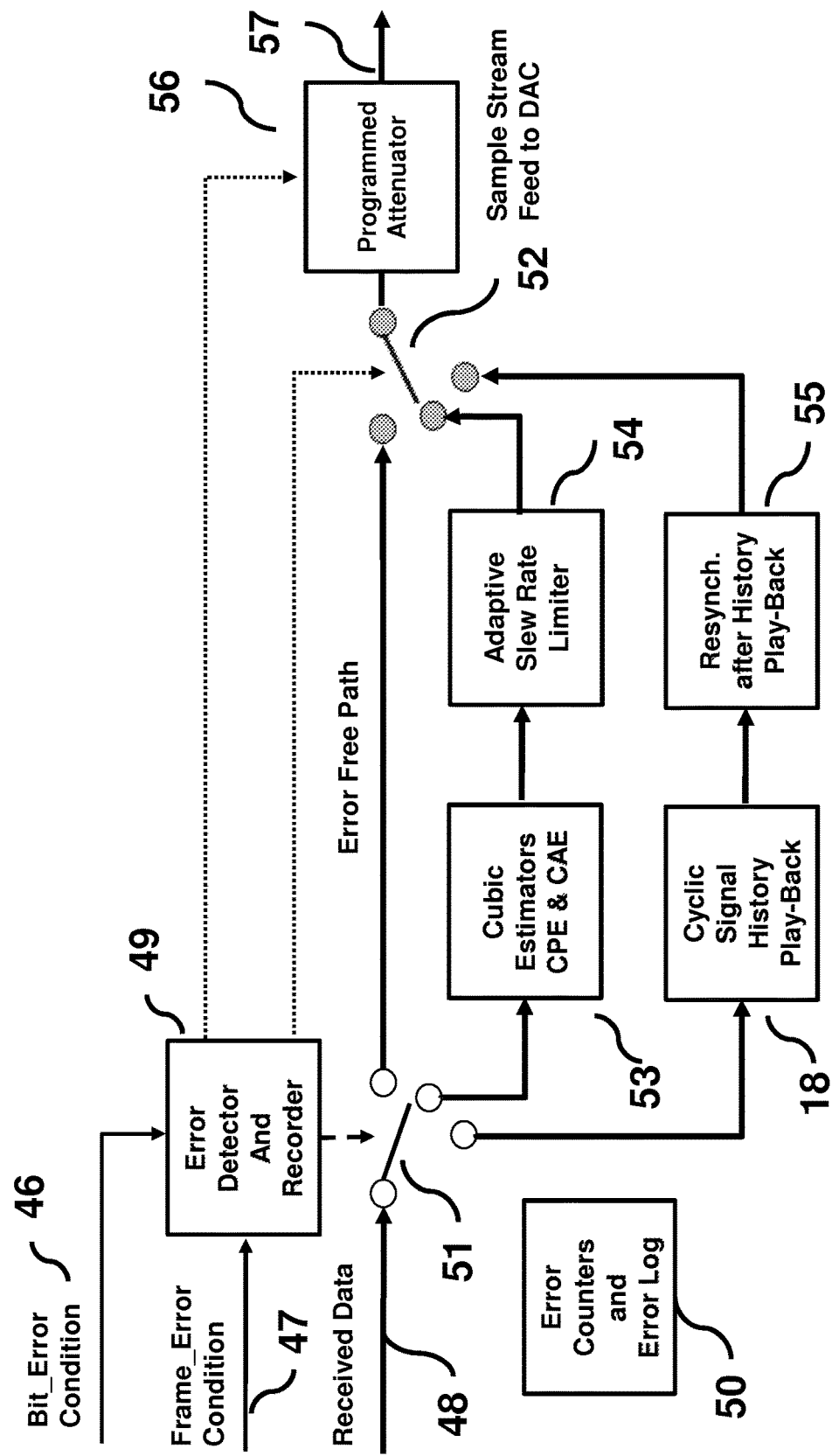
FIG. 9 shows as a block diagram the aggregate of the cubic forward error concealment method and functional blocks of the receiver stations of the preferred embodiment in accordance with this invention.

FIG. 9 shows as a block diagram the composite cubic error concealment method in accordance with this invention. The error detector and recorder block 49 receives the bit-error 46 and frame-error 47 indications, records them to the error counters and to the error log 50, and selects either the error-free path, the sample error concealment path or the frame error concealment path for the received data 48, 57 sample stream. The error-free path is a direct link from the received data 48 to the output sample stream 57 via the programmed attenuator 56. In the bit errors path the received data 48 is first directed to the cubic estimator bank 53 where the most appropriate cubic estimation method is applied to it. In our example embodiments we use polynomial estimators in general and in this preferred embodiment the third-order, cubic estimators in particular. After estimation, the bit errors concealment path goes to the adaptive slew rate limiter block 54 illustrated in more detail in FIG. 25. For the frame errors, the cyclic signal history play-back path is activated. There the cyclic signal history play-back block 18 aligns the beginning of the lost frame with the recorded signal history buffer and injects signal data to the output data stream from it. The details of this operation are illustrated in FIGS. 27-30. If a pre-set limit value of lost frames is exceeded, the signal history play-back block 18 activates the signal fading. The next block is the resynchronization after history play-back block 55. It takes care of the smooth removal of fading and the smooth signal joint from the history buffer audio stream back to the received audio data stream. The joining is illustrated in FIGS. 30 and 31 as the smooth joining algorithm used with the example embodiment is given in FIG. 32. Synchronous logical branch switches 51 and 52 are under the control of the error detector of block 49 as is the programmed attenuator 56.

Figure 10:
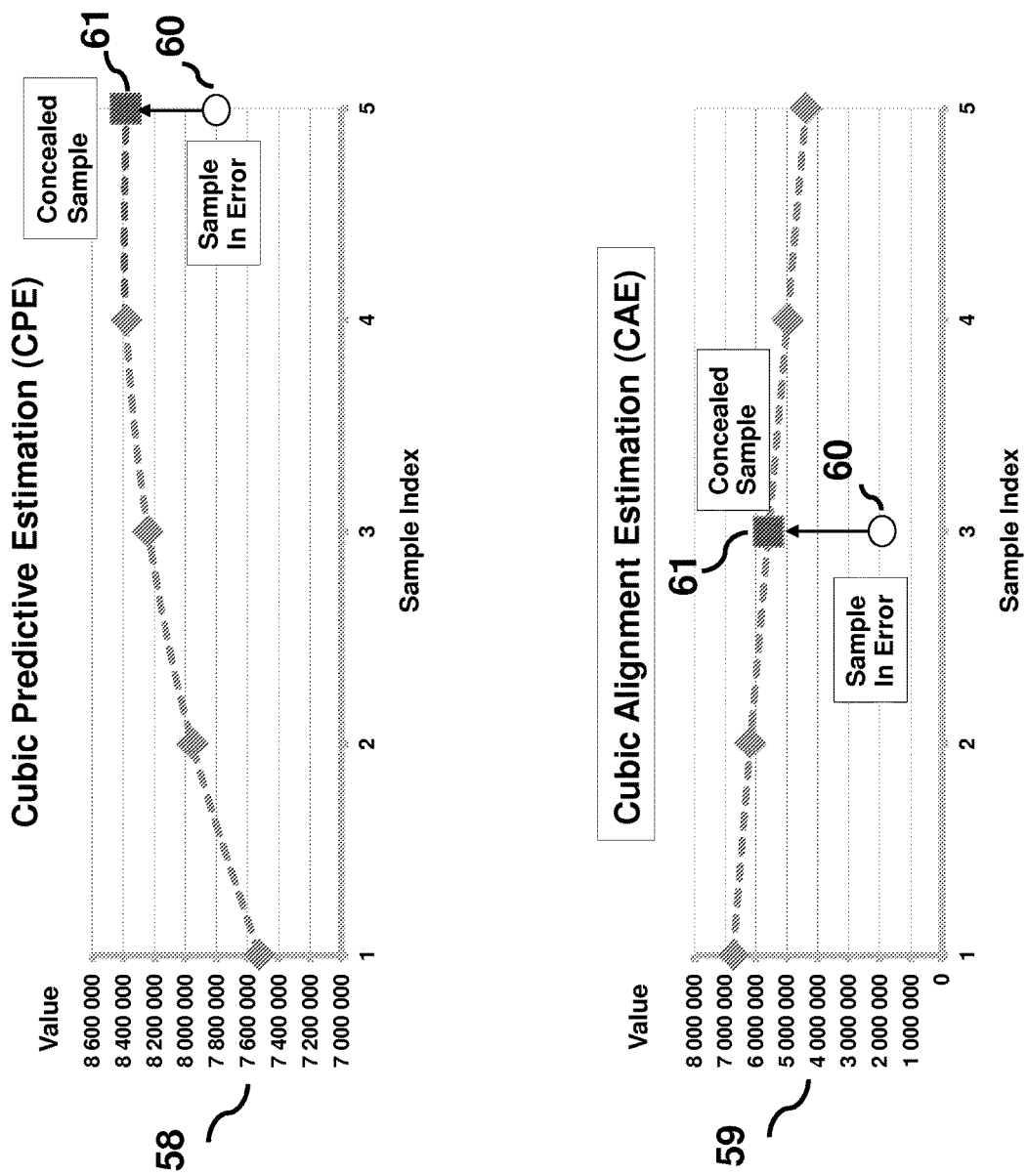
FIG. 10 shows as a graph the effects of the cubic predictive and interpolation estimations as applied to the samples in error in accordance with this invention.

FIG. 10 shows as signal plots two of the available three cubic estimation methods, the Cubic Predictive Estimation (CPE) 58 and the Cubic Alignment Estimation (CAE) 59 and illustrates how the erroneous sample value 60 is adjusted to the estimated value 61. The third Estimation works in a similar fashion to the second 59.

Figure 11:
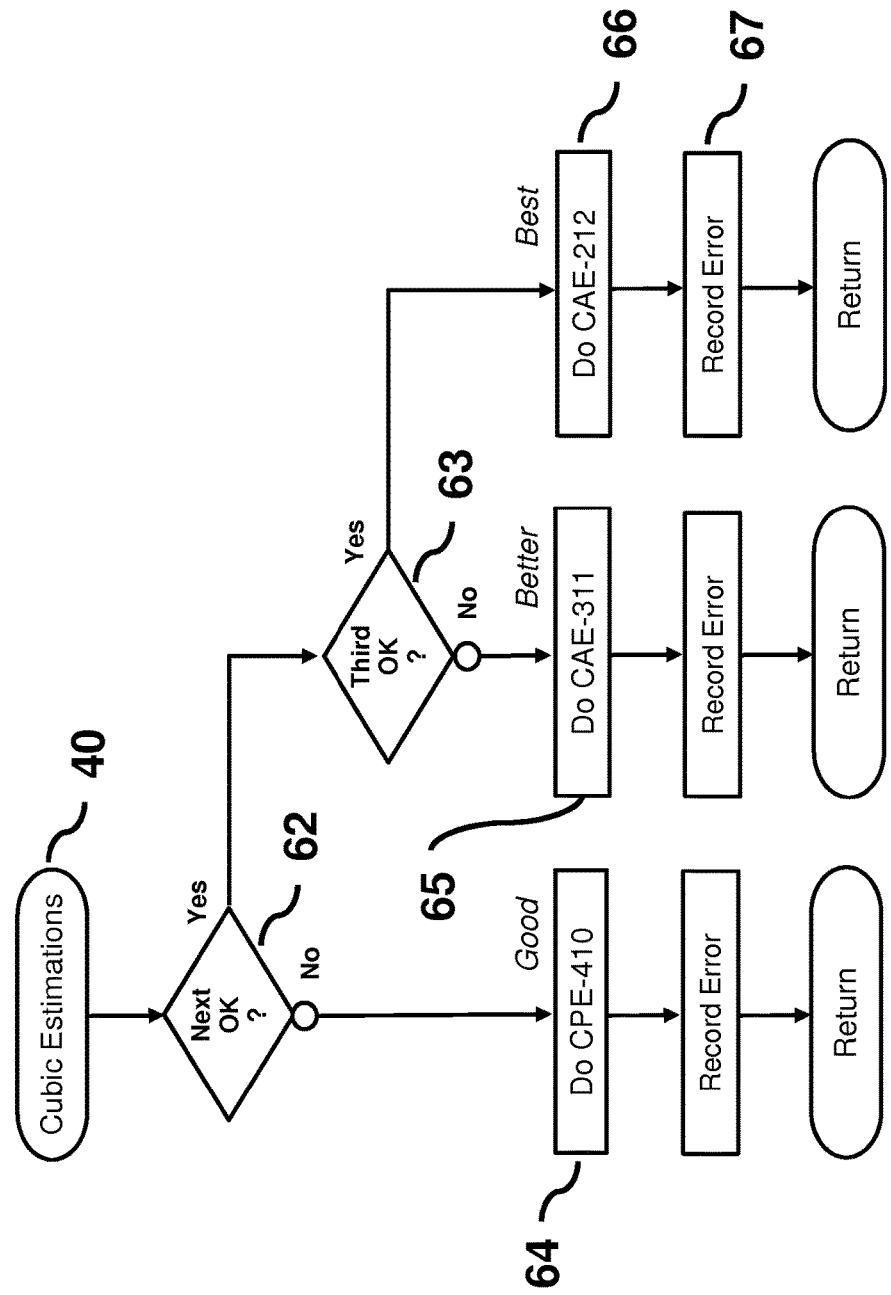
FIG. 11 shows as a flow chart the operation of the cubic extrapolation and alignment interpolation methods together with the error statistics updating in the receiver stations of the preferred embodiment in accordance with this invention.

FIG. 11 shows as a flow chart the operation of the cubic estimator bank in accordance with an exemplifying embodiment of the invention. The cubic estimations process 40 starts with the check 62 of the next sample immediately following the one with one or more detected errors. If there are bit errors also in the next received sample, the cubic predictive forward estimation 64, labeled as CPE-410 is chosen. Alternatively, this predictive method may always be used if a lowest possible latency is preferred. Its operation is shown in FIG. 12. If the next sample is free of bit errors, the sample immediately after it is tested 63 next. If there are bit errors in it, the cubic alignment estimation based on three preceding samples and one following sample 65 of that to be estimated is done. It is labeled as CAE-311. Otherwise the highest-quality, four sample point estimation 66, labeled as CAE-212, is performed. It is based on two preceding and two following error-free samples. After any of these alternative estimations is performed, the concealment action is recorded 67 to the error counters and the error log, and the estimation is ready. The CPE-410, CAE-311, and CAE-212 algorithms of the example embodiment are shown as matrix calculations in FIGS. 12, 13, and 14, respectively.

FIG. 12 shows as a matrix calculation the cubic predictive estimation algorithm, CPE-410 of the example embodiment in accordance with the invention.

FIG. 13 shows as a matrix calculation the cubic alignment estimation algorithm, CAE-311 of the example embodiment in accordance with the invention.

FIG. 14 shows as a matrix calculation the cubic alignment estimation algorithm, CAE-212 of the example embodiment in accordance with the invention.

Figure 15:
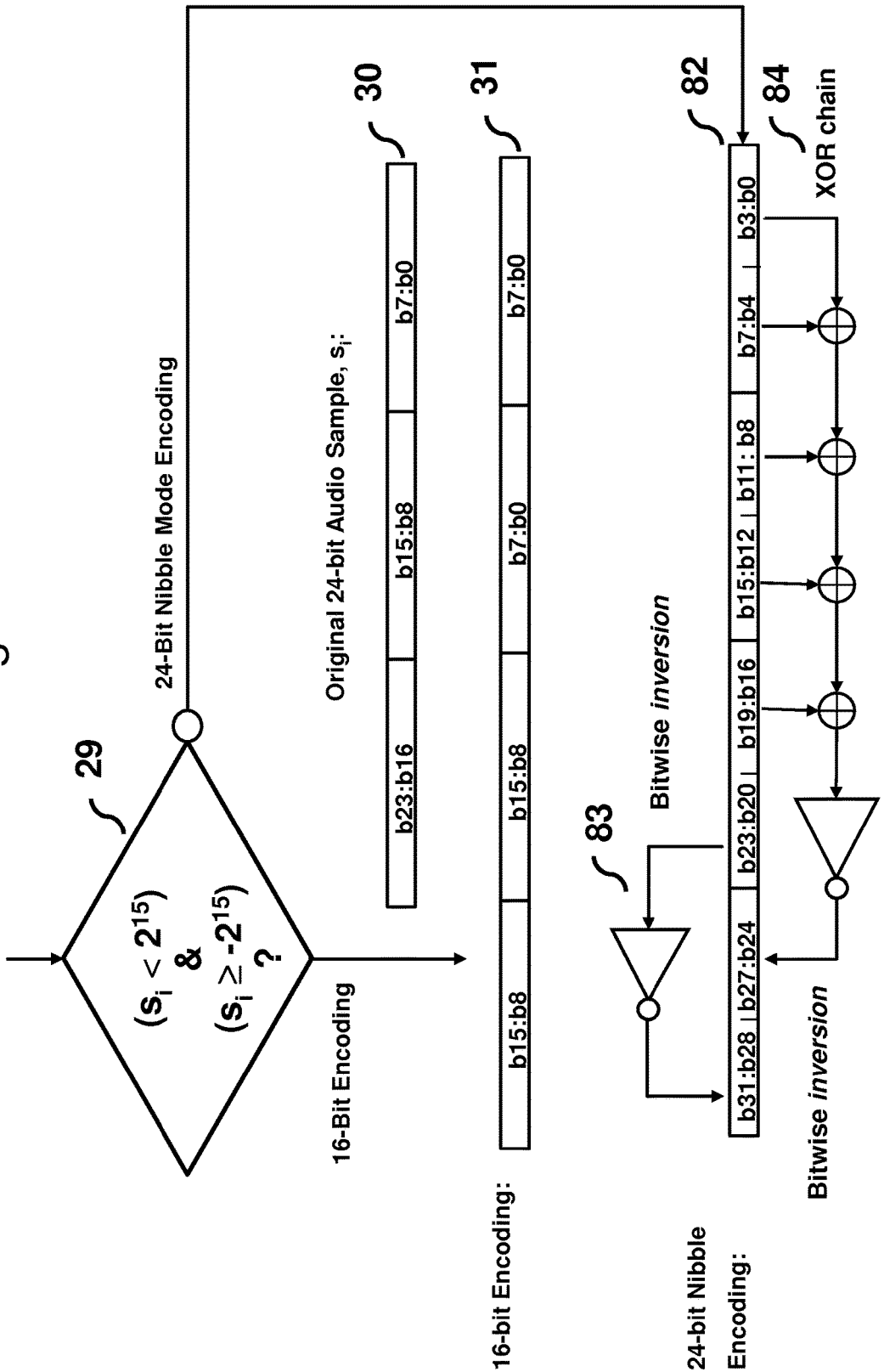
FIG. 15 shows as a flow chart the operation of the 24-bit nibble mode forward error concealment encoding method in the transmitter station of the preferred embodiment in accordance with this invention.

FIG. 15 illustrates the dual mode nibble encoding 10 used with one of the most preferred embodiment in accordance with this invention. In this embodiment the 24-bit samples of the incoming uncompressed digital audio stream are first tested for their magnitude 29. If the sample 30 can be presented with 16 bits, the 16-bit byte based encoding mode 31 is selected. Otherwise the 24-bit nibble mode encoding 82 is used. The 24-bit nibble mode encoding is done so that the encoded forward error correction bits [b31:b28] are the bitwise inversion of sample bits [b23:b20] and forward error correction bits [b27:b24] are the bitwise inversion of the modulo two sum (exclusive or) of nibbles [b19:b16], [b15:b12], [b11:b8], [b7:b4], and [b3:b0].

Figure 16:
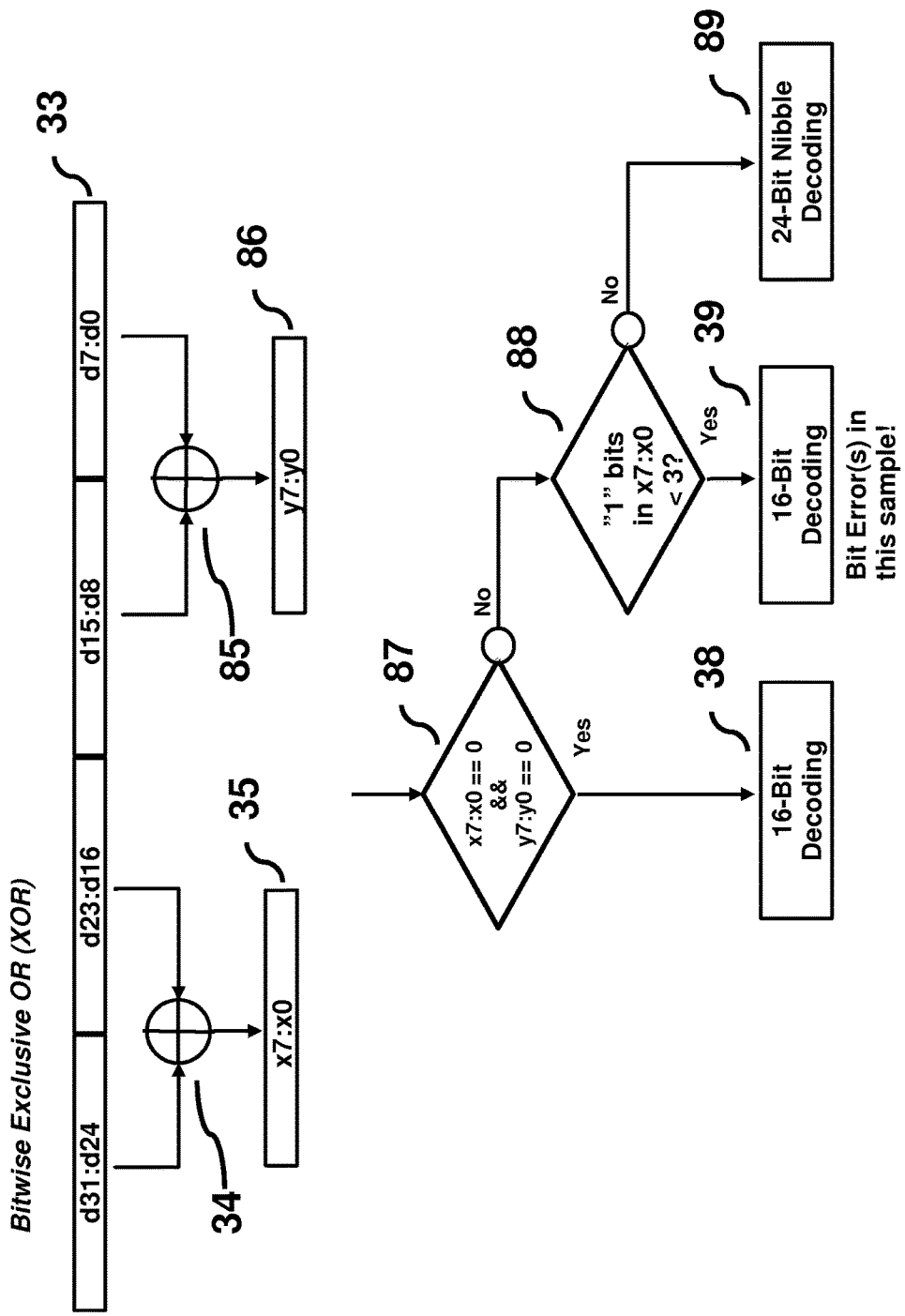
FIG. 16 shows as a flow chart the first step of the 24-bit nibble mode forward error concealment decoding method in the receiver stations of the preferred embodiment in accordance with this invention. With this first step the mode of the received sample is determined.

FIG. 16 shows as a flow chart the nibble based dual mode decoding with bit errors detection and position indication taking place in parallel in all receiver stations. The two highest order data octets [d31:d24] and [d23:d16] as well as the two lowest order data octets [d31:d24] and [d23:d16] of the received 32-bit data word 33 in one of the most preferred embodiment in accordance with this invention are first tested pairwise e.g. by using the bitwise exclusive-or operations 34 and 85 between them. Depending on the results of the testing, 16-bit decoding 38, 16-bit decoding with errors 39 or 24-bit nibble decoding 89 is performed as determined by tests 87 and 89. The details of these three alternatives together with the 16-way polynomial estimation and bit healing methods are shown in FIGS. 17-18 and 20-24. The methods and algorithms are described in more details with these Figures.

Figure 17:
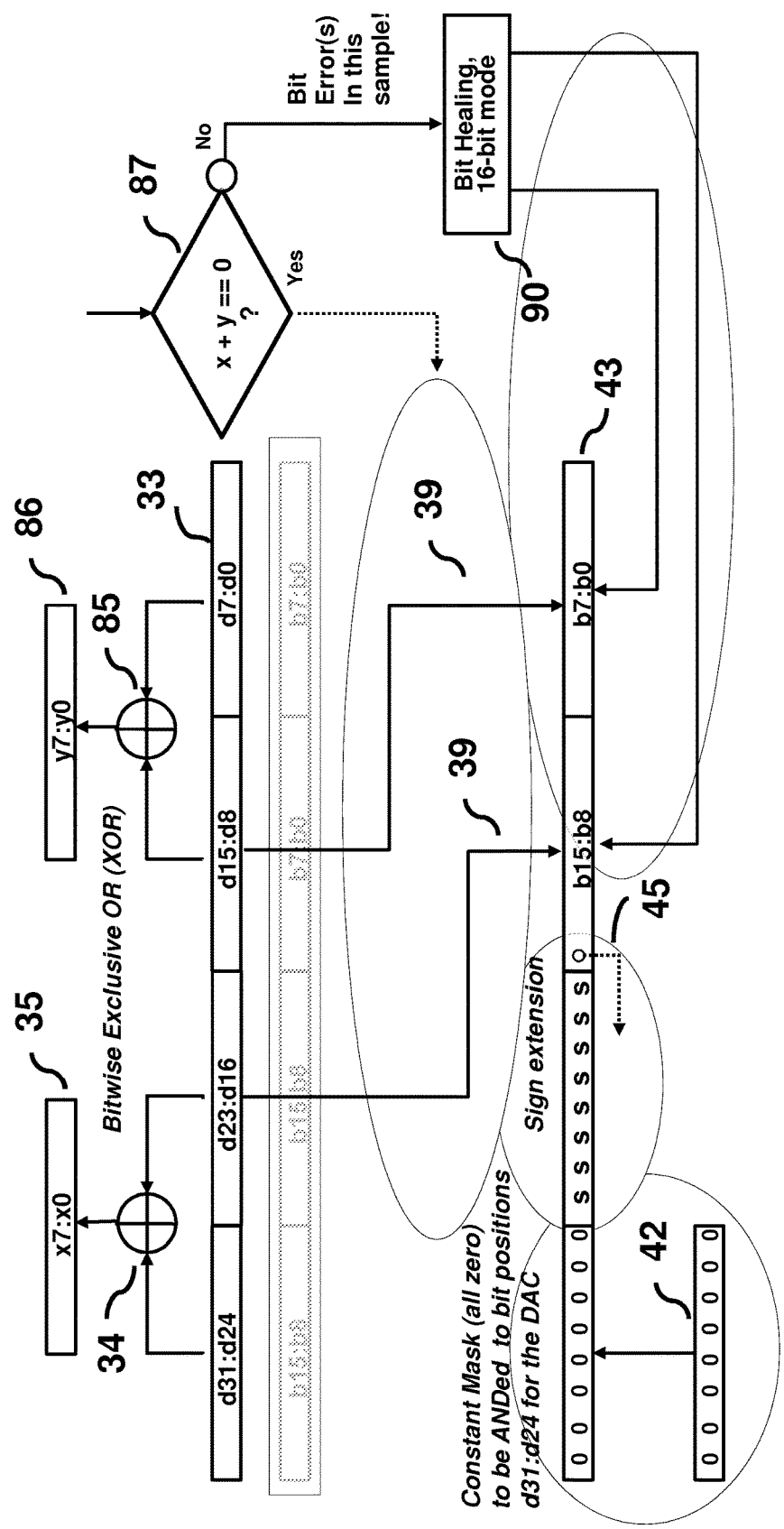
FIG. 17 shows as a flow chart the 16-bit mode operations of the 24-bit nibble forward error concealment decoding method in the receiver stations of the preferred embodiment in accordance with this invention. With this step the error-free 16-bit mode sample is directly decodes and the 16-bit mode sample with errors is concealed by 16-bit byte based bit healing method.
Figure 22:
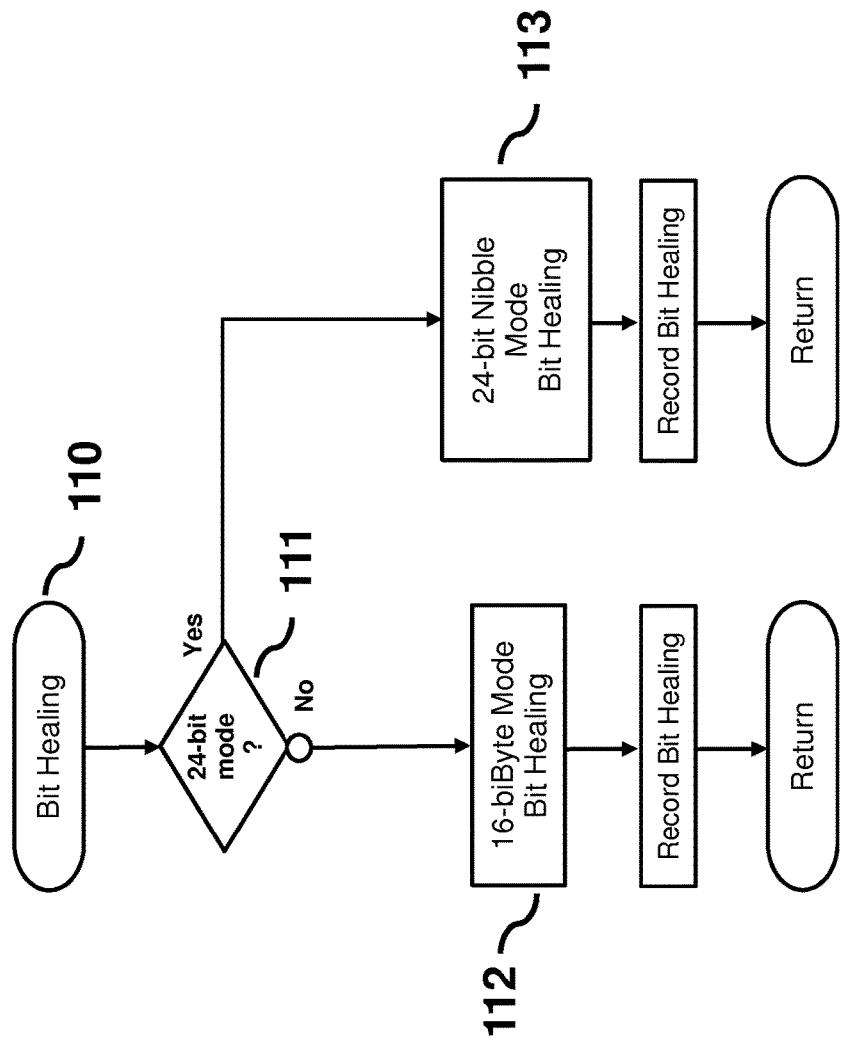
FIG. 22 shows as a flow chart the bit healing algorithm with its 16-bit and 24-bit modes as used in the receiver stations of the preferred embodiment in accordance with this invention.
Figure 23:
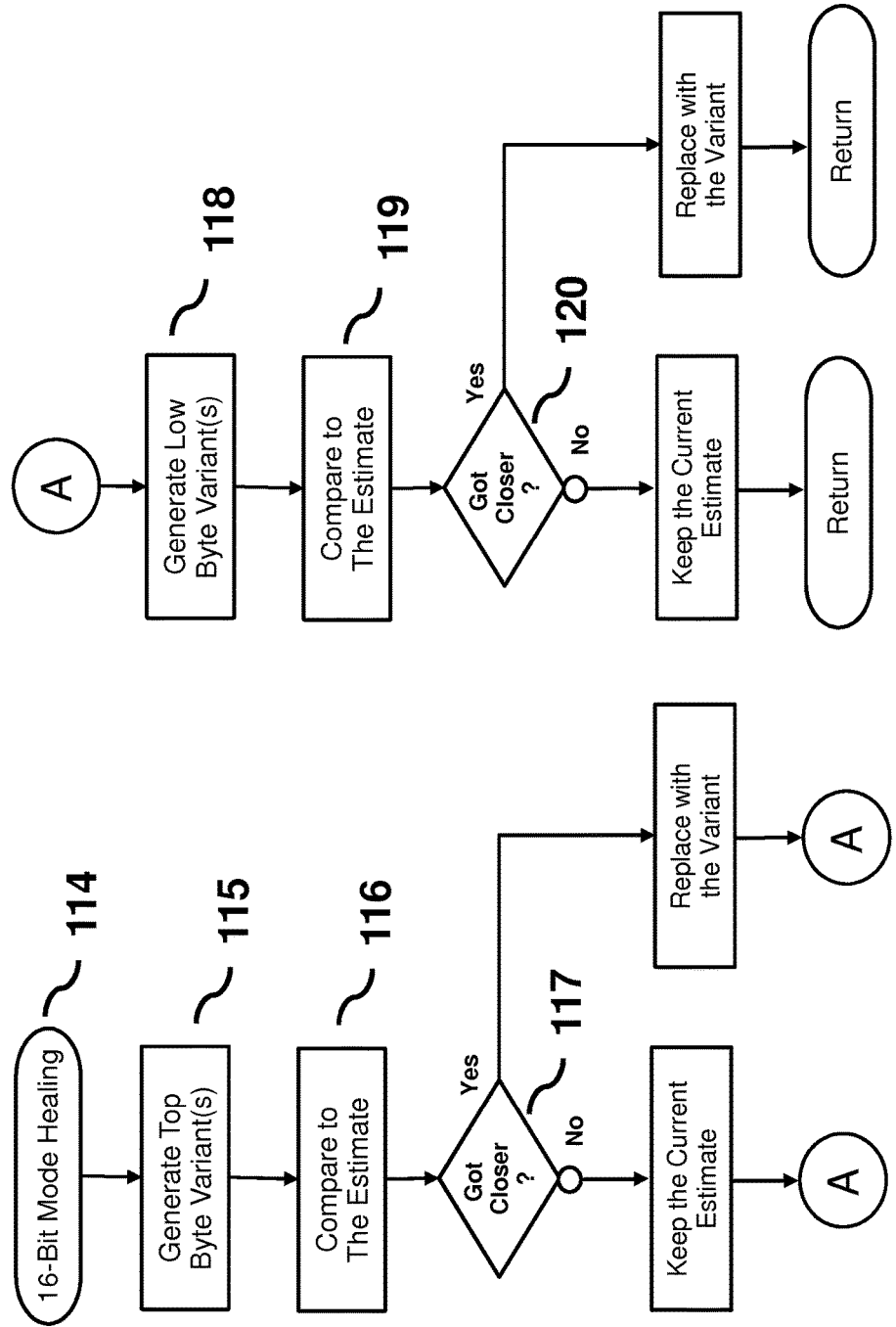
FIG. 23 shows as a flow chart the 16-bit mode byte based bit healing algorithm as used with the receiver stations of the preferred embodiment in accordance with this invention.

FIG. 17 shows the details of the 16-bit byte mode decoding without and with errors present in the received sample. In the 16-bit decoding, in one of the most preferred embodiment in accordance with this invention, the sample data word 43 is generated from the received data word 33 by shifting it right by eight bit positions 44, extending the 16-bit mode sign bit 45 to the whole word, and by forcing its bits [d31:d24] to zero by applying the bitwise AND-operation with the mask octet 42 to it. This is the method when there are no errors. Errors are considered to be present e.g. if the sum of the modulo two sums of high bytes [x7:x0] 35 and the low bytes [y7:y0] 86 is non-zero. Bits having the value one ("1") in x and y indicate the bit error positions in the high byte and the low byte, respectively. If there are one or more bit errors the 16-way polynomial estimation is performed, followed by byte based 16-bit byte mode bit healings 90 as shown in FIGS. 21-23.

Figure 18:
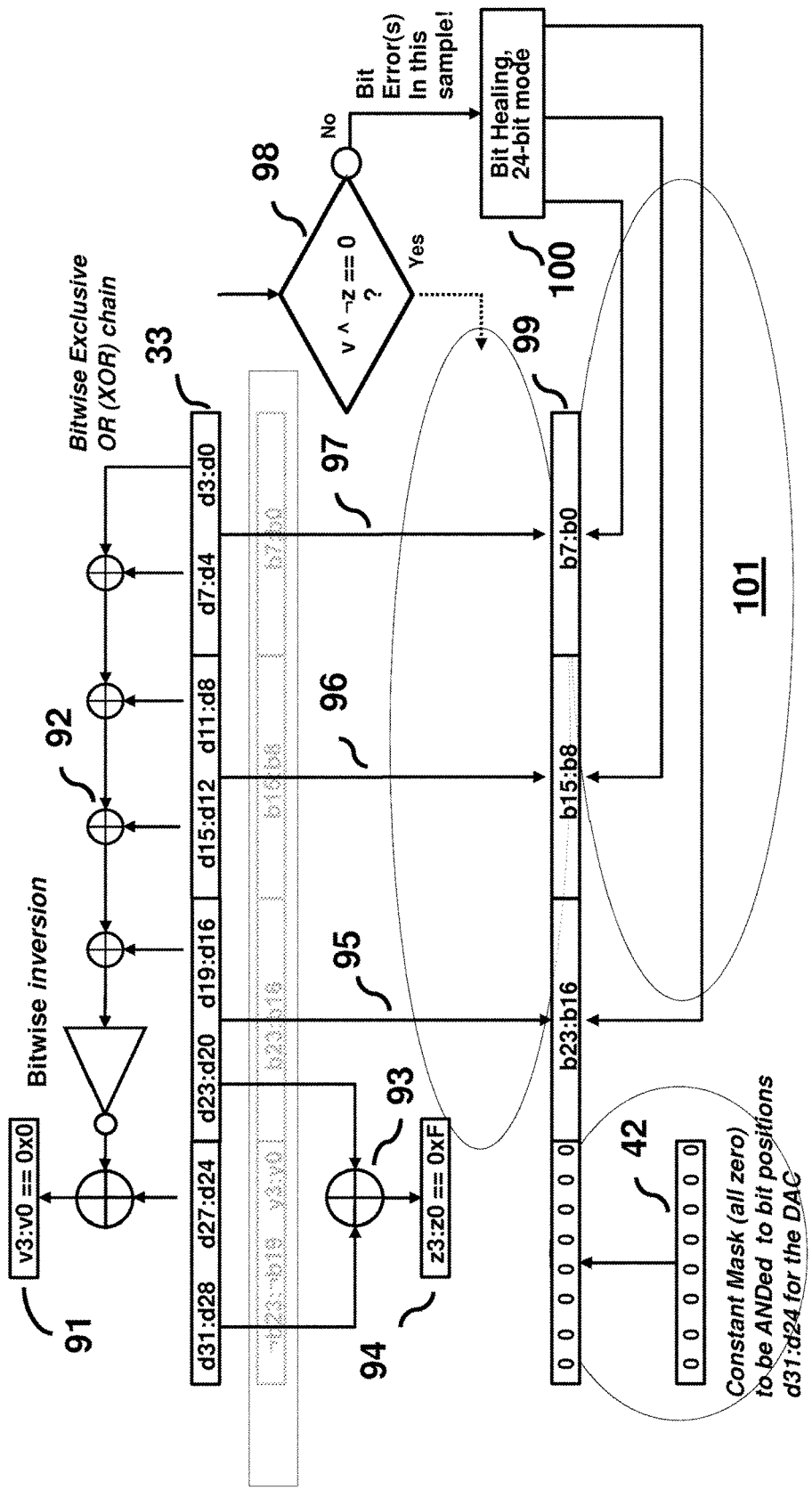
FIG. 18 shows as a flow chart the 24-bit mode operations of the 24-bit nibble forward error concealment decoding method in the receiver stations of the preferred embodiment in accordance with this invention. With this step the error-free 24-bit mode sample is directly decodes and the 24-bit mode sample with errors is concealed by the iterative 24-bit nibble based bit healing method.
Figure 24:
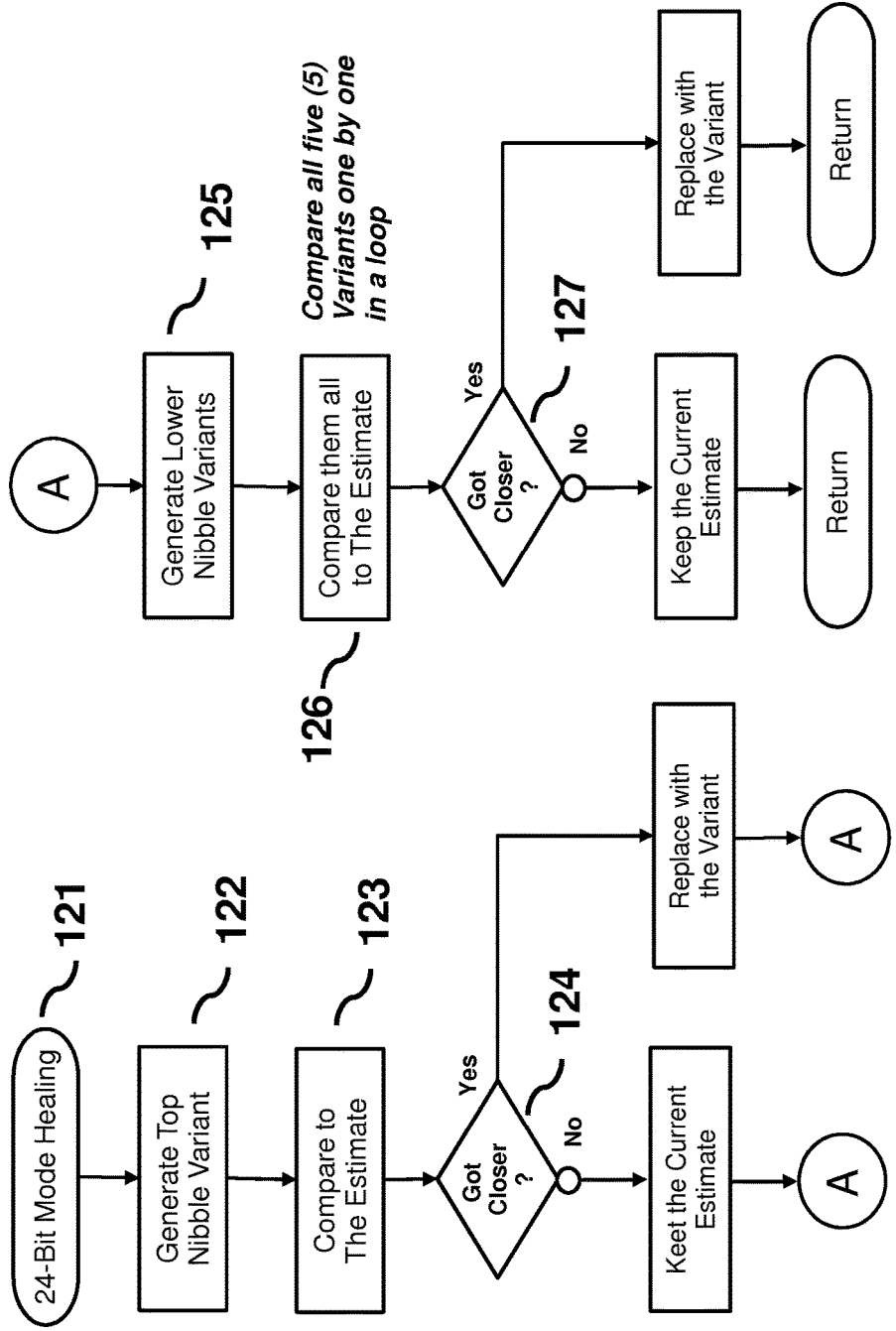
FIG. 24 shows as a flow chart the 24-bit mode nibble based bit healing algorithm as used with the receiver stations of the preferred embodiment in accordance with this invention.

FIG. 18 shows the details of the 24-bit nibble mode decoding without and with errors present in the received sample. In the 24-bit nibble mode decoding, in one of the most preferred embodiment in accordance with this invention, the sample data word 99 is generated from the received error-free data word 33 simply by forcing its bits [d31:d24] to zero e.g. by applying the bitwise AND-operation with the mask octet 42 on it. This is the method when there are no errors. If there are one or more bit errors, the 16-way polynomial estimation is done followed by nibble based 24-bit mode bit healing 100, 101 as shown in FIGS. 21, 22, and 24. Errors are considered to be present e.g. when the modulo two sum 87 of the modulo two sum of [d31:d28] and [d23:20] 93 called [z3:z0] 94 and the inversion of the modulo two sum 92 of [d19:d16], [d15:d12], [d11:d8], [d7:d4], and [d3:d0] with [d27:d24], called [v3:v0] 91 results in a non-zero value.

Figure 19:
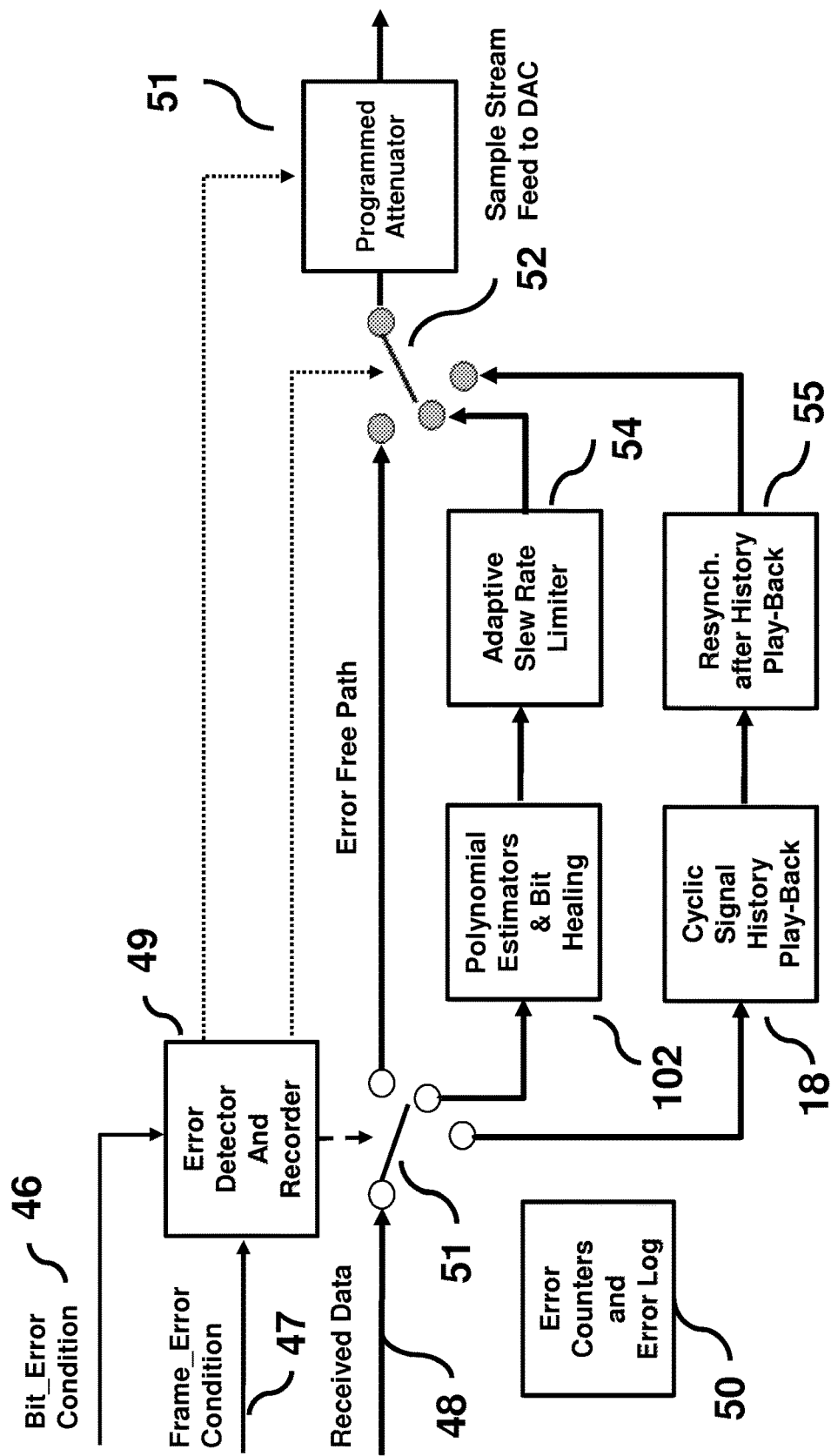
FIG. 19 shows as a block diagram the aggregate of the polynomial estimation forward error concealment method with bit healing and functional blocks of the receiver stations of the preferred embodiment in accordance with this invention.

FIG. 19 shows as a block diagram the composite nibble based error concealment method in accordance with this invention. It is equivalent with FIG. 9 with the exception of block 102, the polynomial estimators and bit healing which replaces the cubic estimators block 53 of FIG. 9. All other blocks are described in FIG. 9. The polynomial estimators are described in FIG. 21 and the bit healing in FIGS. 22-24.

Figure 20:
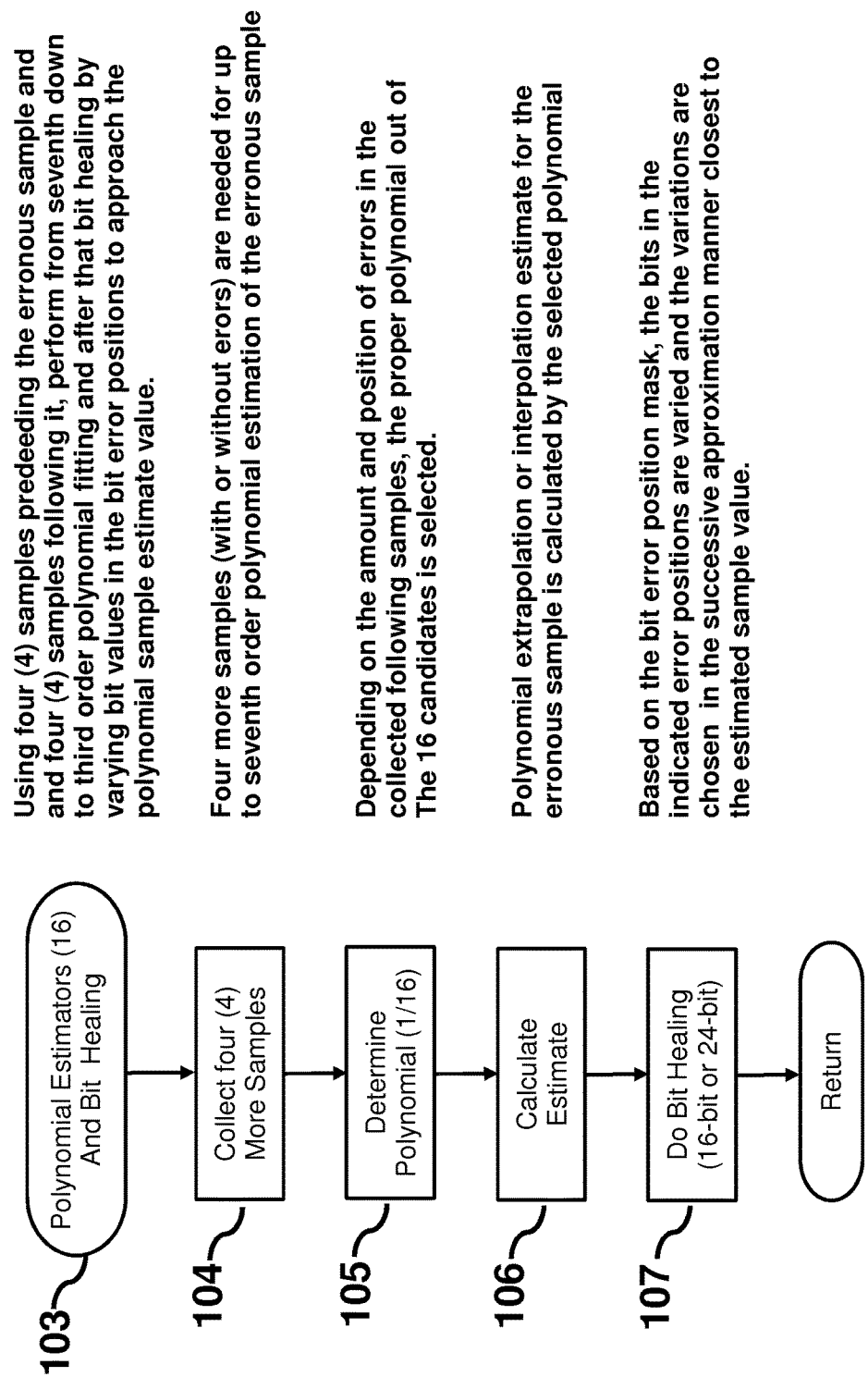
FIG. 20 shows as a flow chart the polynomial estimation and bit healing algorithm of the receiver stations of the preferred embodiment in accordance with this invention.

FIG. 20 shows as a flow chart the main components of the polynomial estimators and the bit healing algorithms 103. As up to seventh-order polynomials may be used in the estimation there are preferably four sample points available before the erroneous sample and also another four after it.

The collection of the four following samples with the associated extra latency of four sample periods is represented by block 104. The selection of the polynomial to be used for the estimation depends solely on the amount and position of the available error-free samples after the erroneous one. An example of suitable selection rules is shown in FIG. 21. After selection the estimate is calculated 106. The optional 16-bit mode byte based healing 112 and the 24-bit nibble based healing 113, block 107, finish the algorithm.

FIG. 21 presents the generic estimation polynomial 108 used in one of the most preferred embodiment in accordance with this invention. This formula calculates the estimate for the concealment of the erroneous received sample by polynomial fitting to four previous correct or concealed sample points and up to four following error-free data points. The coefficients to the formula are shown in coefficients table 109 where the selection key is the pattern of error-free samples among the four following samples x[5]-x[8]. In practical implementations the formula should be optimized for speed case by case with special attention to overflow and underflow avoidance.

FIG. 22 shows as a flow chart the generic bit healing algorithm 110 and the particular 16-bit byte mode bit healing 112 and 24-bit nibble healing 113 used in one of the most preferred embodiment in accordance with this invention. Selection between the healing modes is done based on the mode of the sample being concealed 111.

FIG. 23 shows as a flow chart the 16-bit mode byte healing algorithm 114 used in one of the most preferred embodiment in accordance with this invention. The algorithm starts with the generation of the top byte variants 115 for the sample being concealed. The variants are generated based on the bit error position indicator bit vector byte [z7:z0] 94 shown in FIG. 16. The variants are then compared 116, one by one, to the calculated estimate and if the variant is closer to estimate than the current value of the sample, the variant replaces it 117. When the high byte is processed, the same operations 118, 119, and 120 are applied to the low byte using the bit error position indicator bit vector byte [y7:y0] 86 shown in FIG. 16.

FIG. 24 shows as a flow chart the 24-bit mode nibble healing algorithm 121 used in one of the most preferred embodiment in accordance with this invention. The algorithm starts with the generation of the top nibble variants 122 for the sample being concealed. The variants are generated based on the bit error position indicator bit vector nibble [v3:v0] 91 shown in FIG. 18. The variants are then compared 123, one by one, to the calculated estimate and if the variant is closer to estimate than the current value of the sample, the variant replaces it 124. When the high nibble is processed, the same operations 118, 119, and 120 are applied to the remaining five lower nibbles are processed in the same manner using the bit error position indicator bit vector nibble [v3:v0] 91 shown in FIG. 18.

Adaptive Slew Rate Limitation

Figure 25:
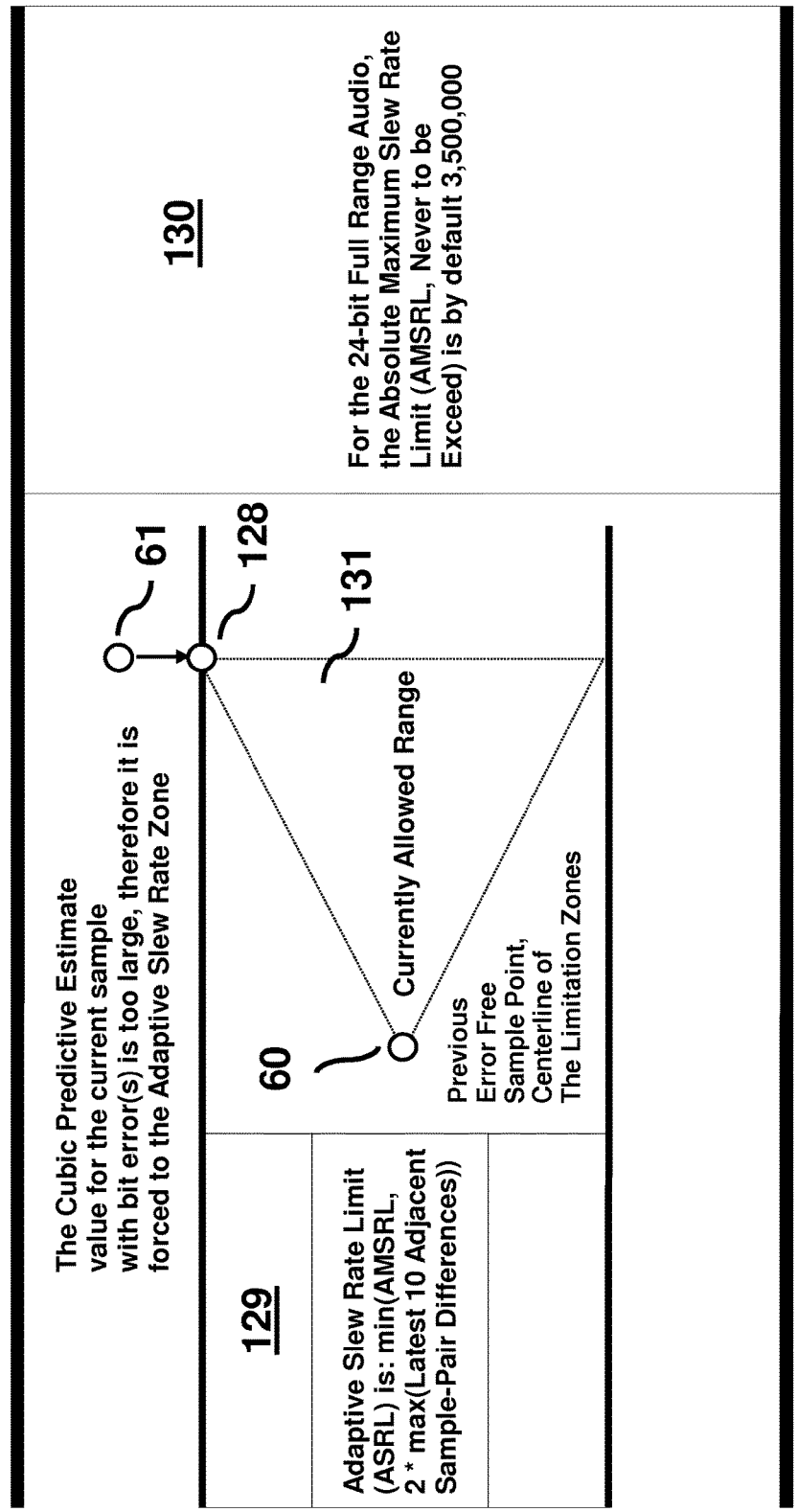
FIG. 25 shows as a graph the principle of the adaptive slew rate limitation method, called ASRL, used in the receiver stations of the preferred embodiment in accordance with this invention.

FIG. 25 shows the adaptive slew rate limitation as used with the example embodiment in accordance with the invention. Further details of the adaptive slew rate limitation are provided hereinafter.

Channel Formatting

FIG. 26 shows as a block diagram the dynamic channel formatting that may be used with the example embodiment in accordance with the invention.

Frame Loss Concealment

Figure 27:
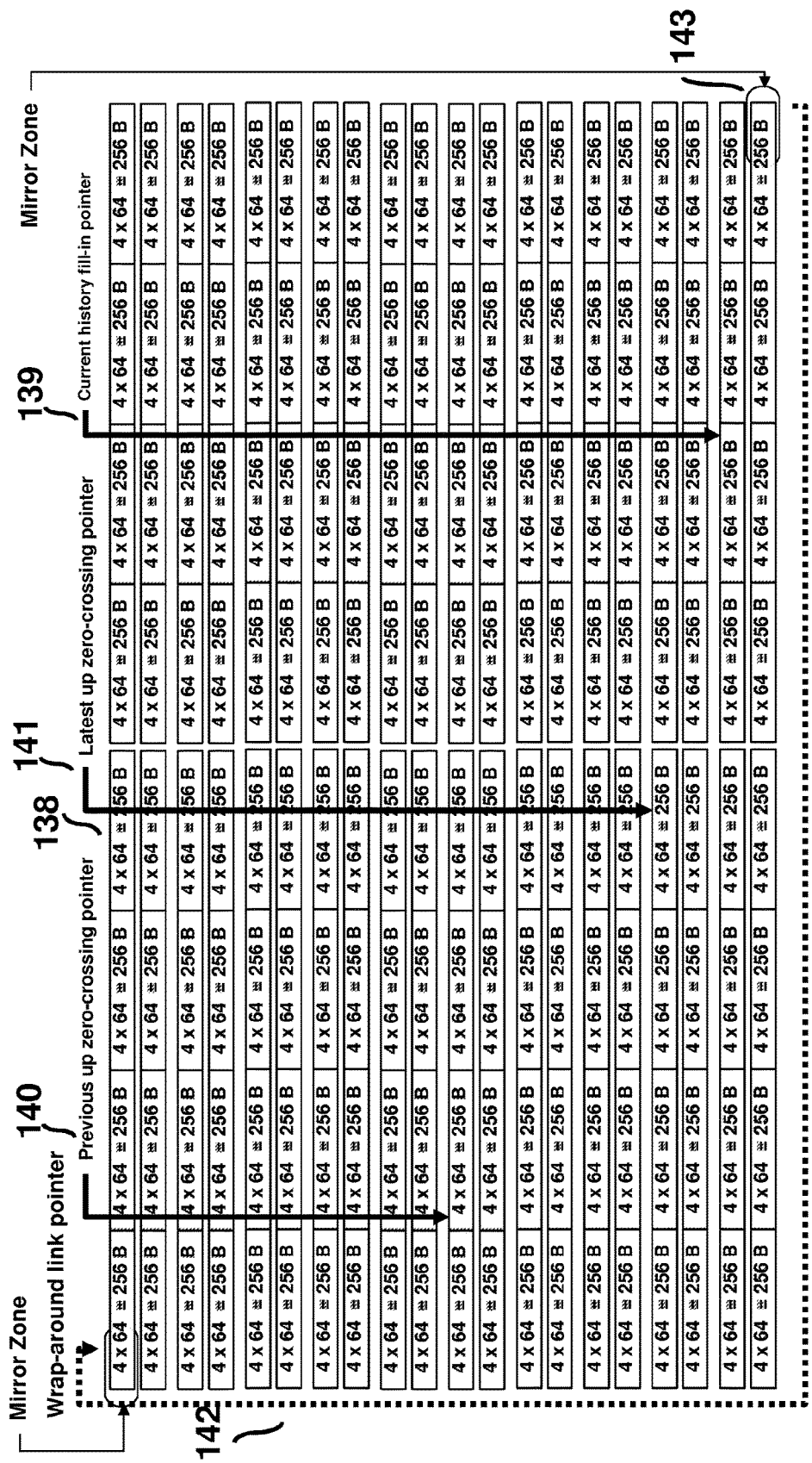
FIG. 27 shows as a data structure the signal history buffer used in the receiver stations of the preferred embodiment in accordance with this invention.

FIG. 27 shows as a data structure the memory organization of the signal history buffer, the relevant pointers to it, and the special data mirror zone as used with the example embodiment in accordance with the invention.

Figure 28:
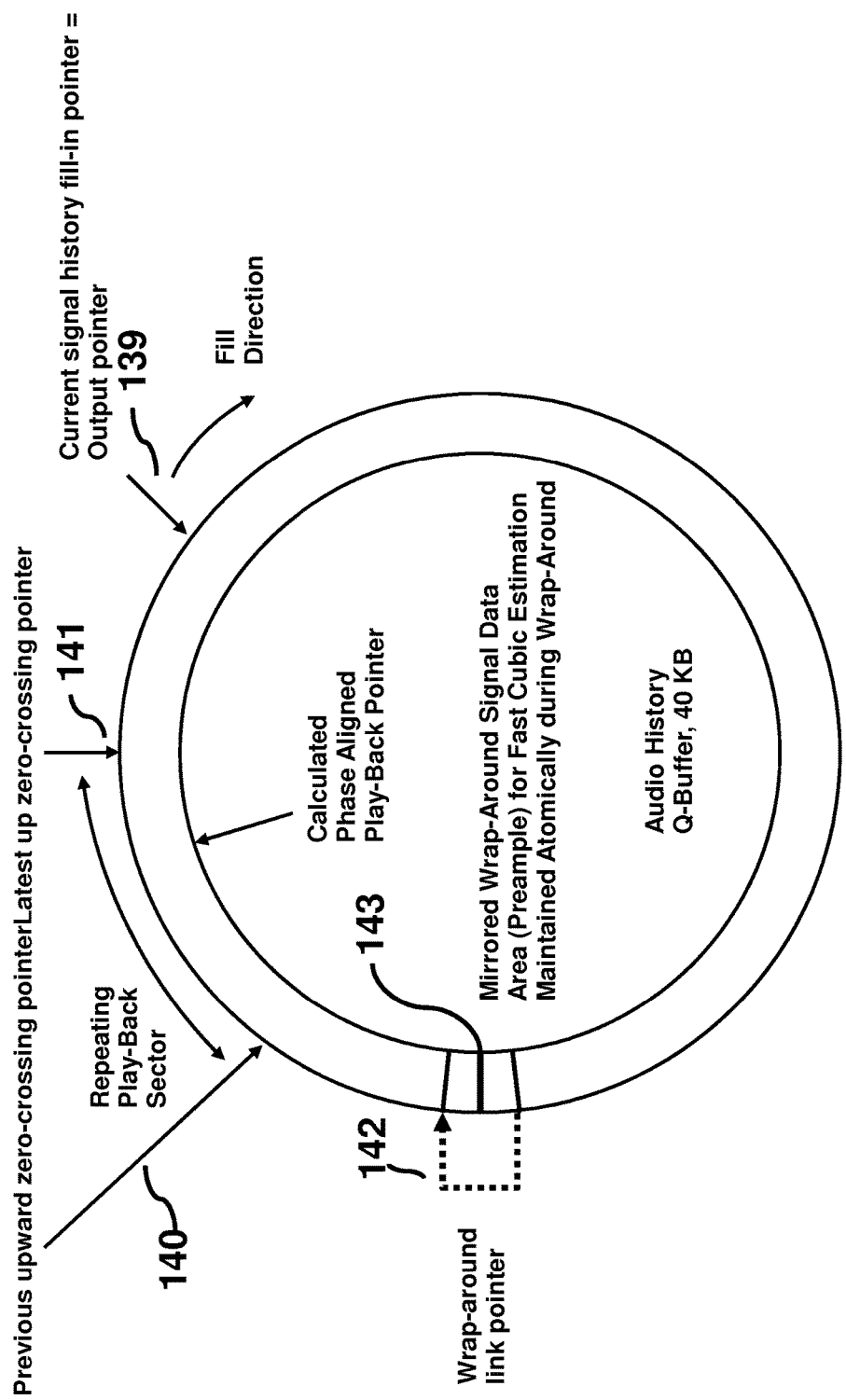
FIG. 28 shows as a diagram the signal history buffer operation used in the receiver stations of the preferred embodiment in accordance with this invention.

FIG. 28 shows as a diagram the memory organization of the signal history buffer the relevant pointers to it and the data mirror zone as used with the example embodiment in accordance with the invention. It also illustrates how the buffer may be used for the phase alignment and the circular play-back. For the fast application of the estimation algorithms, the special mirrored data area 89 and a wrap-around pointer 88 are used in accordance with an embodiment of this invention.

Figure 29:
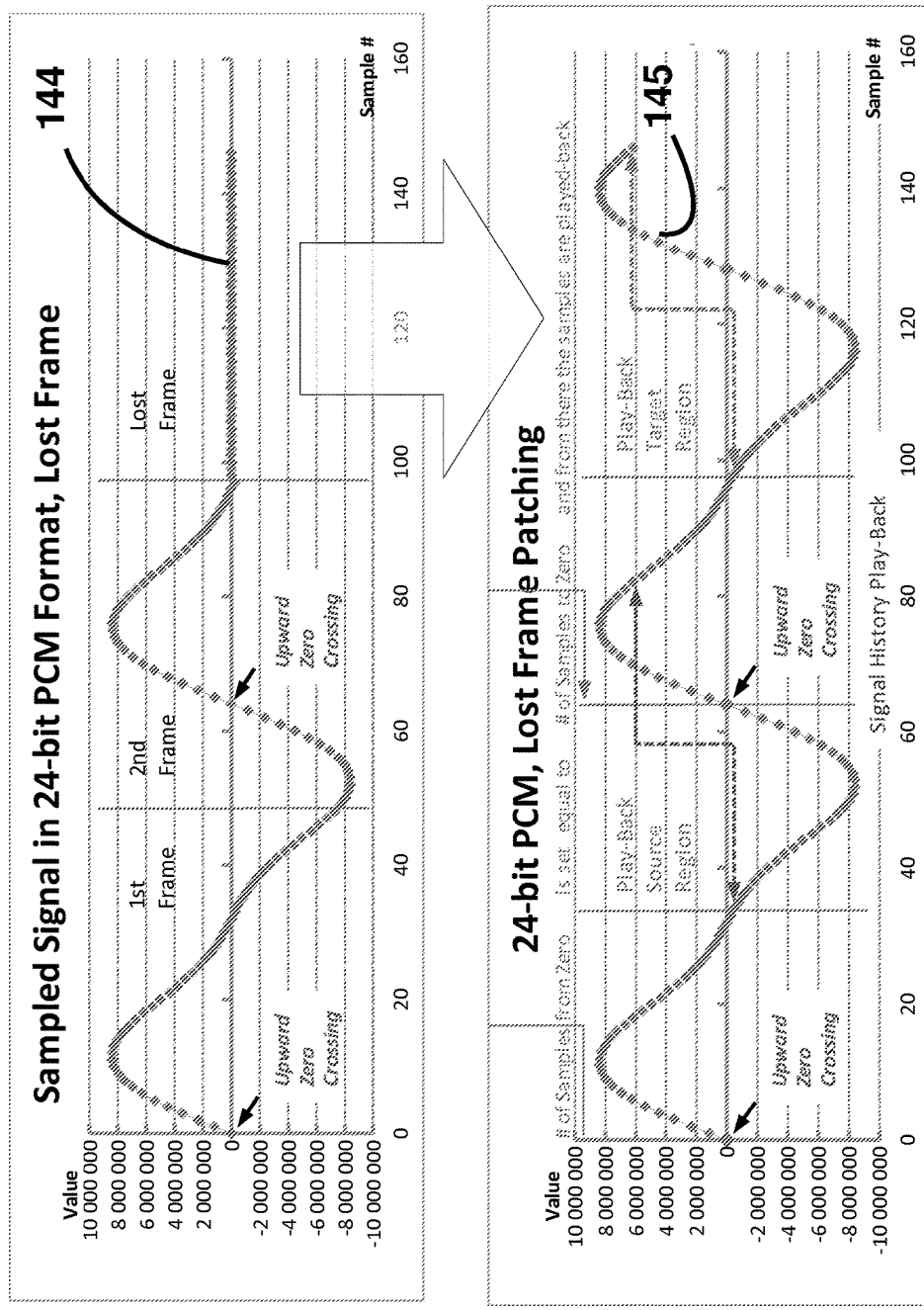
FIG. 29 shows as a signal graph pair the circular signal history play-back operation of the receiver stations of the preferred embodiment in accordance with this invention.
Figure 30:
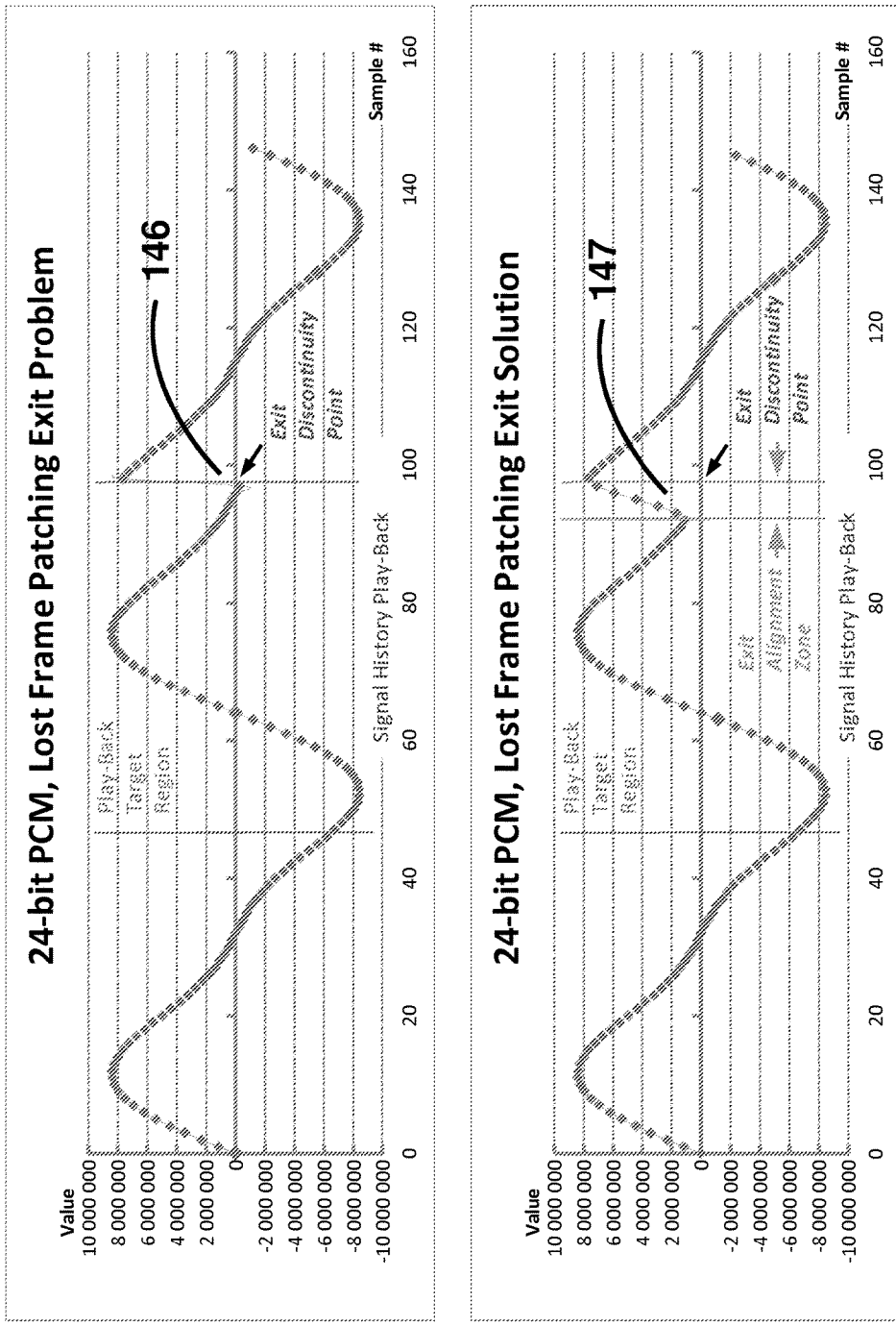
FIG. 30 shows as a signal graph pair the smooth exit from the circular signal history play-back to normal frame reception operation of the receiver stations of the preferred embodiment in accordance with this invention.

FIG. 29 shows as a signal track pair the operation of the lost frame concealment with signal history play-back as used with the example embodiment in accordance with the invention.

FIG. 30 shows, as a signal track pair, the smooth return from the lost frame concealment using signal history play-back when a frame has again been captured as used with the example embodiment in accordance with the invention. The smooth removal of the possible fading is the reverse process of fading.

FIG. 31 shows as a signal track detail the smooth return from the lost frame concealment using signal history play-back when a frame has again been captured as used with the example embodiment in accordance with the invention.

FIG. 32 shows, as matrix calculation, the cubic alignment estimation algorithm, CAE-252, for the smooth joint from signal history play-back signal to the received frame signal as used with the example embodiment in accordance with the invention.

Error Handling

Figure 33:
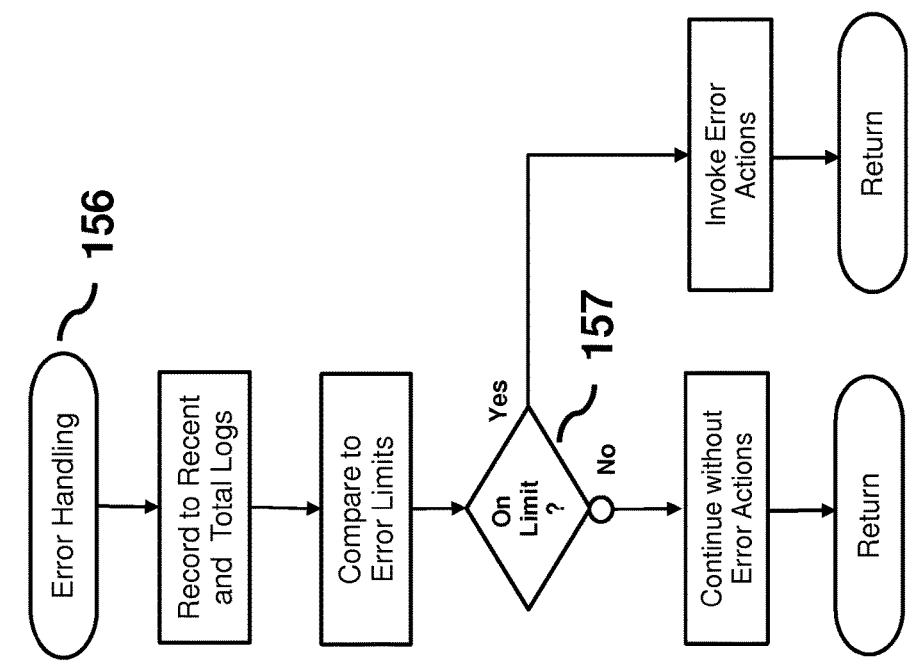
FIG. 33 shows as a flow chart the generic error handling algorithm used in the receiver stations of the preferred embodiment in accordance with this invention.

FIG. 33 shows as a flow chart the generic error handling algorithm 156 used in one of the most preferred embodiment in accordance with this invention. All detected errors with the bit error position indicators are first recorded to the error counters and to the error log. The counters of recent errors are then compared 157 to the preset error limits and if the limit is met the corresponding error actions are initiated.

Frame Loss Management and Soft Mute Fading

Figure 34:
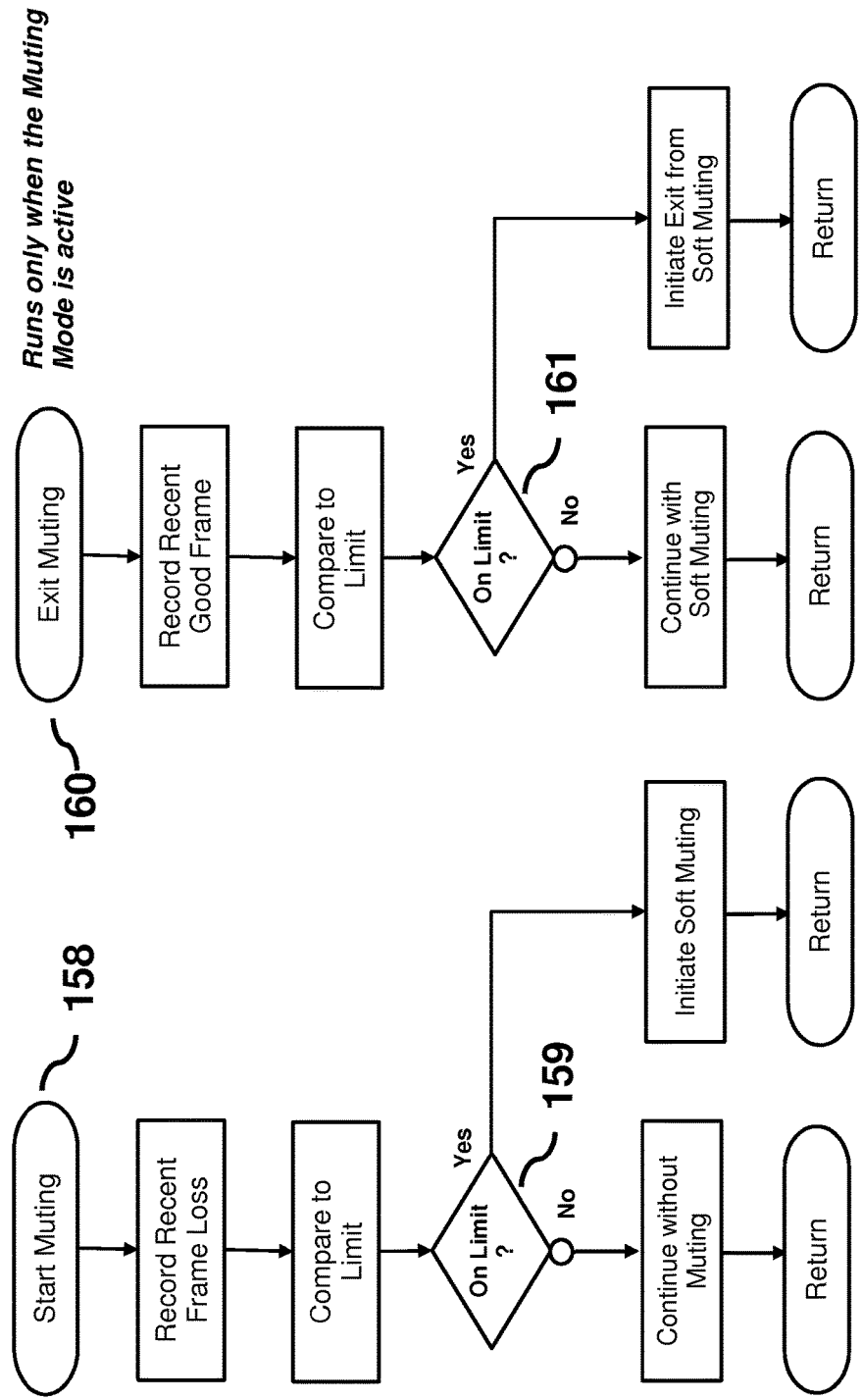
FIG. 34 shows as a flow chart the lost frame management and the soft mute fading algorithms used in the receiver stations of the preferred embodiment in accordance with this invention.

FIG. 34 shows as a flow chart the generic loss management and muting algorithm 158, 160 used in one of the most preferred embodiment in accordance with this invention. Frame losses are recorded to the total and recent frame loss counters as well as to the error log. The recent frame loss counter is then compared to the preset frame loss limit and if met 159, the soft muting process is initiated. During the soft muting process the volume of the signal is decreased smoothly while the behavior of the recent good frames counter is monitored at the same time. Again, when the recent good frames counter limit is met 161, the exit from soft muting process is initiated.

Re-Sampling

FIG. 35 shows, as matrix calculation 162-167, the cubic re-sampling estimation algorithm, labeled as CRE-3/4, for the double rate re-sampling as used with the re-sampling example embodiment in accordance with the invention. Further details regarding re-sampling are provided hereinafter.

Figure 36:
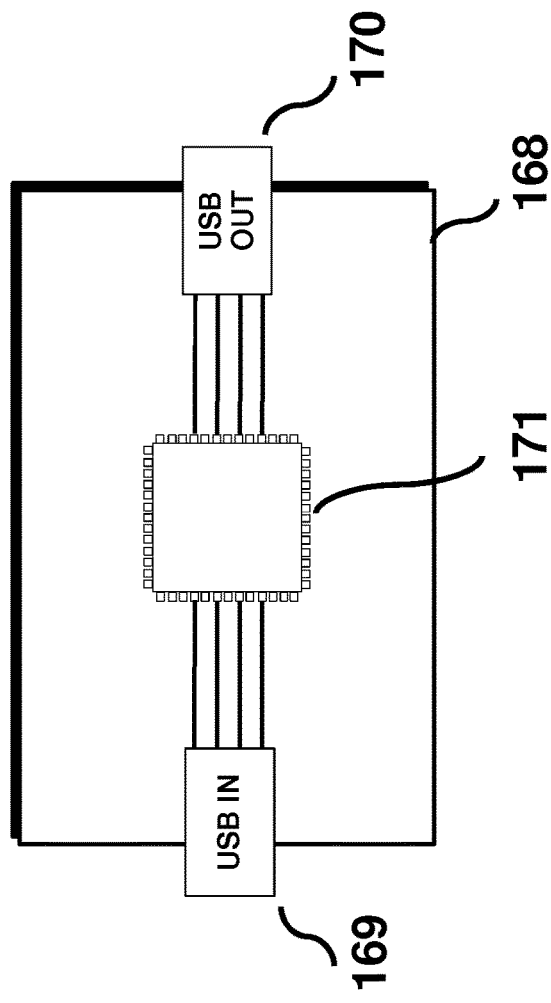
FIG. 36 shows as a printed circuit board lay-out the principal components of a sampling rate doubler apparatus based on the cubic re-sampling estimation algorithm, called CRE-3/4, shown in FIG. 35.

FIG. 36 illustrates as a printed circuit board outline a High Speed USB implementation of the sampling frequency doubler. The original sample data stream enters the printed circuit board 108 via the USB IN connector 109, together with the +5 V power, to the microcontroller 111 having internal flash and random access memories. The CRE-3/4 program is permanently stored in the flash memory and directly executed from there. The random access memory is the working data memory needed for the variables and intermediate results of the integer calculations. Output data stream appears on the USB OUT connector again together with the 5 V supply voltage. Depending on the resources of the microcontroller, other even more elaborated versions of the polynomial interpolation such as the six base points, fifth-order polynomial can additionally be supported. As the High Speed USB ports are supported by the modern single-chip microcontroller, signal sampling speed doubling of 240 Mbit/s to 480 Mbit/s can be implemented very economically.

Multi-Mode Coding Methods, Encoding, Decoding, Error Detection, and Error Position Indication An important enabler of embodiments of this invention is a multi-mode coding for forward error concealment combining the efficient encoding and decoding for both the low-amplitude and the high-amplitude digital signals, such as uncompressed, periodic, bandwidth-limited digital signals, in such a way that an error-resistant, very low latency error detection, error bit position indication, and signal-specific, per-sample, on-the-fly error concealment is made possible. The multi-mode coding may be provided e.g. as a dual mode coding providing two coding modes, employed as an example of the multi-mode coding approach throughout this document.

The two most preferred embodiments, the cubic estimation and the polynomial estimation with the bit healing that may be employed together with multi-mode decoding are elaborated here, and their characteristics are summarized in FIG. 2.

FIGS. 5 and 15 provide examples illustrating an embodiment in accordance with the encoding methods described hereinbefore providing the multi-mode encoding as a dual-mode encoding employing a 16-bit coding mode and a 24-bit coding mode. As shown in FIG. 5 for the cubic style preferred embodiment with 24-bit digital data, the encoding of the signal, done e.g. in the transmitter, starts by the value magnitude test 29 as the predetermined criteria referred to hereinbefore. If the sample value 30 can, with this example embodiment, be represented with 16 bits, the 16-bit encoding 31 is done. Otherwise, the 24-bit encodings 32 and 82 must be used. In the 16-bit cubic encoding the more significant octet of the 16-bit value is replicated to the two bytes of the more significant end of the 32-bit word while the least significant octet of the 16-bit value is replicated to the two bytes of the less significant end of the 32-bit word 31. In the 24-bit cubic encoding the bits of the most significant octet of the 24-bit value are first inverted and the resulting pattern is inserted as the most significant byte of the 32-bit word 32. This completes the cubic encoding which may be followed by the optional encryption 13 with a preset transmission crypto key 14 shared by the transmitter and the receivers. Corresponding description for the example illustrated in FIG. 15 is provided hereinbefore.

In general, the multi-mode encoding of a digital signal comprising a sequence of individual digital samples comprises encoding one or more of the individual digital samples according to an encoding mode selected from a number of predetermined encoding modes in accordance with a value of the respective digital sample. The encoding comprises determining an encoded digital sample as a combination of bits of the respective digital sample and a predetermined number of forward error concealment bits arranged into predetermined bit positions of the encoded digital sample in accordance with the selected encoding mode, as described hereinbefore and hereinafter in more detail in context of the most preferred embodiments of the invention.

The encoding may also be generalized into encoding according to a number of encoding modes, which encoding modes comprise at least a first encoding mode and a second encoding mode, wherein the first encoding mode is applied to a given digital sample in response to the value of the given digital sample meeting a first predetermined criterion, and wherein the second encoding mode is applied to the given digital sample in response to the value of the given digital sample meeting the second predetermined criterion. Moreover, the number of encoding modes may comprise more than two encoding modes, each associated with a criterion for employing the respective encoding mode. The dual-mode encoding described hereinbefore provides a specific example of multi-mode encoding that employs exactly two encoding modes.

As an example of the first and second criteria, the value of the given sample meeting the first predetermined criterion may comprise the absolute value of the given sample not exceeding a predetermined threshold value, whereas the value of the given sample meeting the second predetermined criterion may comprise the absolute value of the given sample exceeding a predetermined threshold value. As a variation of this approach, the value of the given sample meeting the first predetermined criterion may comprise the value of the given sample to be such that it can be presented with a predetermined number of bits without losing information, whereas the value of the given sample meeting the second predetermined criterion may comprise the value of the given sample to be such that it cannot be presented with the predetermined number of bits without losing information, as described hereinbefore in context of the exemplifying dual-mode encoding making use of 16-bit and 24-bit encoding modes.

Further using the two encoding mode scenario as a non-limiting example, encoding according to the first encoding mode may comprise providing the given digital sample with a first number of forward error concealment bits and encoding according to the second encoding mode may comprise providing the given digital sample with a second number of forward error concealment bits, wherein the first number of bits is larger than the second number of bits, thereby enabling relatively stronger error protection for the digital samples encoded in accordance with the first encoding mode.

Various strategies for determining the forward error correction bits may be employed. Continuing with the exemplifying scenario with the two encoding modes, the first encoding mode may comprise using a first set of predetermined bit positions of the given digital sample as basis for the forward error concealment bits, whereas the second encoding mode may comprise using a second set of predetermined bit positions of the given digital sample as basis for the forward error concealment bits. As example, as described hereinbefore by an example in context of the exemplifying dual-mode encoding making use of 16-bit and 24-bit encoding modes, the first encoding mode may comprise replicating the bits in a first set of predefined bit positions of the given digital sample as the forward error concealment bits, and wherein the second encoding mode comprises using one's complement of the bits in a second set of predefined bit positions of the given digital sample as the forward error concealment bits.

In particular, to describe the exemplifying dual-mode encoding making use of 16-bit and 24-bit encoding modes in more detail in this regard, assuming that the digital samples comprise 24-bit samples with bit 0 indicating the least significant bit position of a digital sample and bit 23 indicating the most significant bit position of the digital sample, the first set employed by the first encoding mode may comprise bit positions from 8 to 15 of the given digital sample, whereas the second set employed by the second encoding mode may comprise bit positions from 16 to 23 of the given digital sample. Consequently, assuming 32-bit encoded digital samples, the first encoding mode may carry bits 0 to 7 of the digital sample in bits 0 to 7 of the encoded digital sample, bits 8 to 15 of the digital sample in bits 8 to 15 of the encoded digital sample, and the forward error concealment bits in bits 16 to 23 and/or in bits 24 to 31 of the encoded digital sample. Similarly, the second encoding mode may carry bits 0 to 23 of the digital samples in bits 0 to 23 of the encoded digital samples, whereas the forward error concealment bits are carried in bits 24 to 31 of the encoded digital sample.

As a variation of this example, the first set may further comprise bit positions from 0 to 7 of the given digital sample. In this variation, the first encoding mode may e.g. carry bits 0 to 7 of the digital sample in bits 0 to 7 of the encoded digital sample, bits 8 to 15 of the digital sample in bits 16 to 23 of the encoded digital sample, whereas the forward error concealment bits are carried in bits 8 to 15 and 24 to 31 of the encoded digital sample.

As another example in this regard, the first set may be similar to that of the previous example or the variation thereof, whereas the second set may comprise bit positions from 20 to 23 of the given digital sample, with the second encoding mode further using one's complement of a modulo-two sum of bit positions 0 to 3, 4 to 7, 8 to 11, 12 to 15 and 16 to 19 of the given digital sample as further forward error concealment bits. Consequently, bits 0 to 23 of the digital sample may be carried in bits 0 to 23 of the encoded digital sample, while the forward error concealment bits are carried in bits 24 to 31 of the encoded digital sample.

In general decoding of a digital signal data stream comprising a sequence of encoded individual digital samples comprises decoding one or more of the individual encoded samples into respective decoded digital samples according to a decoding mode selected from a number of predetermined decoding modes in accordance with a detected encoding mode of the respective encoded digital sample, wherein the encoding mode is detected on basis of the value of one or more bits of the encoded digital sample, as described hereinbefore and hereinafter in more detail in context of the most preferred embodiments of the invention. Said one or more bits may comprise one or more sets of predetermined bit positions of an encoded individual digital sample.

The encoding modes may comprise the first and second encoding modes, as described hereinbefore in context of the multi-mode encoding of a digital signal. Consequently, decoding a given encoded digital sample may comprise reversing the operations carried out as part of the respective encoding mode in order to reconstruct the respective digital sample. Examples of the decoding are described hereinbefore by using the 16-bit and 24-bit coding modes as examples of the first and the second coding modes.

The reception operation of the transmitted data frames encoded with the cubic method as received in the receiver stations is outlined in FIG. 9. At the time for the expected reception of the next frame, the receiver stations perform a test to see if the frame is entering or not 49. If a frame is lost, the signal history play-back operation 18, described in more detail later, may be invoked. If a frame was captured as a part of the normal reception, the optional encryption is first decrypted 13 with the preset reception crypto key 14.

The dual mode cubic decoding 53, including the eventual cubic sample estimations 53, in the case that bit errors are detected in test 21, is followed by the optional channel formatting 23, history recording 24, and output signal feed 25 routines as described below and illustrated in FIGS. 7-8, 10-14.

Bit Error Concealment

In case the encoding mode applied to a given encoded digital sample cannot be identified, e.g. in case the value of one or more bits of the given encoded digital sample indicate a coding mode that is not an encoding mode corresponding to any of said number of predetermined decoding modes or the value of one or more bits of the given encoded digital sample explicitly indicate an error condition, the given encoded digital sample is considered as an encoded digital sample including one or more bit errors. Examples of identifying a digital sample including one or more bit errors are described hereinbefore by using the dual-mode coding employing the 16-bit and 24-bit coding modes as examples.

Whenever one or more bit errors are detected in a sample, the bit error concealment process may be invoked. In accordance with the preferred example embodiments in accordance with this invention, bits error concealment by polynomial extrapolation or interpolation estimation using the most efficient variant allowed by the previous and following samples may be performed, as shown in FIGS. 11 and 21. Although any computable function, for example polynomials of any degree, can be used, we have chosen the third order, cubic polynomials for the first example embodiments used in describing the related estimation methods in accordance with this invention. This is done partly for practical reasons since the linear methods are well known and are of limited performance. The third-order polynomials further offer two turning points for the estimation, which is well suited for periodic signals including audio signals. Although higher order polynomials e.g. up to the order of seven or even beyond can readily be implemented in order to further improve the resulting signal quality, the third-order polynomials in the integer domain typically provide signal quality sufficient for a number of applications at a reasonable computational complexity while on the other hand higher-order polynomials provide improved signal quality with a cost of increased computational complexity. This is even more so with other kinds of estimation functions, such as the harmonic functions. Hence, the choice of most suitable estimation approach typically depends on available computing capacity and required signal quality of a given application.

The bit error concealment processing may be generalized as the forward error detection decoding further comprising selecting, in response to a failure to detect the encoding mode of a given encoded digital sample, a sample value estimation approach to be applied to estimate a value of the given decoded digital sample, wherein the sample value estimation approach comprises determining an estimated value of the given decoded digital sample on basis of one or more decoded digital samples preceding and/or following the given digital sample. Said one more decoded digital samples preceding and/or following the given digital sample may comprise one or more decoded digital samples preceding the given digital sample to minimize latency introduced by the sample value estimation approach. As an example, the one more decoded digital samples preceding and/or following the given digital sample comprise one or more decoded digital samples preceding the given digital sample to minimize latency introduced by the sample value estimation approach. Alternatively or additionally, as further examples, the one more decoded digital samples preceding and/or following the given digital sample comprise one or more decoded digital samples following the given digital sample to improve accuracy of the sample value estimation approach.

The sample value estimation process may employ a polynomial, e.g. a cubic polynomial having the order of three, as described in context of preferred embodiments of the invention hereinbefore and hereinafter. As another example, the polynomial may have the order from three to seven or even higher, wherein the order is selected in accordance of the number and the positions of error-free samples preceding and following the given digital sample, as described in context of preferred embodiments of the invention hereinbefore and hereinafter.

The decoding may further comprise a bit healing process comprising determining the bit positions of erroneous bits within the given encoded digital sample, determining a number of candidate values based on the given encoded digital sample by setting the erroneous bit positions thereof to both values, zero and one, and selecting the candidate value closest to the estimated value of the given encoded digital sample as the new estimated value of the given encoded digital sample, as described in context of preferred embodiments of the invention hereinbefore and hereinafter.

In the second example embodiment we use eight neighboring samples to the erroneous one and hence we can apply polynomials of the degree from third to seventh for very accurate estimation, FIG. 21. When the polynomial nibble coding is used we also can extract the bit error positions, 35 with 86 in the 16-bit mode, 91 with 94 in the 24-bit mode, and do the bit healing, as described in the examples provided in FIGS. 22-24.

As shown in FIG. 11, the cubic estimation algorithm first tests if the sample immediately following the sample being estimated contains errors or not 62. If there are bit errors in it, the cubic extrapolation, labeled as CPE-410 and based on the four samples immediately preceding the one to be estimated 54, is used. If the next sample, however, was detected to be error-free, another test for the second next sample 63 is done. If also this sample is detected to be free of bit errors, the estimation is done by cubic interpolation based on two samples immediately preceding the sample to be estimated and another two immediately following it 66 and is labeled as CAE-212. If the test fails, the cubic interpolation has to be based on three samples immediately preceding the sample being estimated and one the next sample after it 55, labeled as CAE-311. The accuracy of CAE-212 is the best followed by CAE-311 and CPE-410 but as two samples after the one to be estimated are required; it introduces the additional latency implied by them as well. The details of the sample estimation algorithms are shown and described in the form of matrix calculations in FIGS. 9, 10, and 11, for CPE-410, CAE-311, and CAE-212, respectively. In them formula (1) gives the general solution for the estimation and the respective estimation formulas for CPE-410, CAE311, and CAE-212 are (2), (3), and (4), respectively.

Dual Mode Polynomial Estimation with Dual Mode Bit Healing

In another most preferred embodiment in accordance with the invention another, more elaborated version of encoding and decoding scheme is used to support bit error position indication. With this coding scheme this embodiment also uses up to seventh order polynomials for sample value estimation based on up to eight neighboring sample points. Since the bit error position can be indicated during the decoding process it is possible with this embodiment also use bit healing where the bit value in the bit error position is varied and the sample variation closest to the estimate is preserved. This most preferred embodiment called polynomial nibble concealment is presented in FIGS. 4, 15-24.

The operation of polynomial nibble concealment is a slight modification of the cubic concealment as can be seen by comparing FIGS. 3 and 4. In the polynomial nibble concealment dual nibble encoding 26 is used instead of the dual mode encoding 12 of the cubic embodiment. For decoding dual nibble decoding 22 is used instead of dual mode decoding 20 and the optional bit healing process 28 can be added, FIGS. 22-24.

Adaptive Slew Rate Limitation

To prevent any possible artifacts being generated by the error concealment algorithms or by the residual low-order bit errors with 24-bit decoding, an adaptive slew rate limitation method may be used in accordance with an embodiment of this invention. The adaptive slew rate limitation may comprise limiting the value of a given decoded digital sample to a value having a difference to a preceding decoded digital sample such that the difference does not exceed a predetermined limit. In other words, the value is limited in such a way that the absolute value of its difference to the value of the preceding decoded digital sample does not exceed the predetermined limit. The preceding decoded digital sample may be e.g. the most recent decoded digital sample or a decoded digital sample preceding the given sample in a predetermined distance (determined as the number of sample positions). The predetermined limit may be an adaptive limit having a value that is determined on basis of one or more decoded digital samples preceding the given decoded digital sample One or more such predetermined limits may be employed, possibly together with one or more further predetermined limits that may be defined in accordance with a bandwidth of the digital signal and/or in accordance of the number of bits employed to represent the value of a digital sample. An example in this regard is illustrated in FIG. 25. In this example, two nested limits are set for the estimated values, an absolute limit 130 and an adaptive limit 129 which both limit the value of the difference of the estimated sample from that of the previous sample. If the value of the estimate falls outside of these limits, it is forced back to the adaptive limit but so that the absolute limit is never exceeded. The adaptive limit can be controlled by the differences of the previous differences of the adjacent samples while the absolute limit should be set according to the upper limit frequency of the signal band.

In other words, the adaptive slew rate limitation may be employed to fine tune the value of a given decoded digital sample. In particular, one or more limits may be employed, e.g. an adaptive limit and an absolute limit, both limits determining a respective maximum allowed difference to the most recent decoded digital sample that has been received without any errors. The most recent decoded digital sample may be, for example, the decoded digital sample immediately preceding the given digital sample in the sequence of digital samples. The absolute limit may be set to a fixed predetermined value, which in case of 24-bit digital samples may be e.g. 3500000. The adaptive limit may be set, for example, to a value that depends on the differences between the values of pairs of consecutive digital samples within a predetermined number of most recently received decoded digital samples according to a predetermined rule, e.g. as twice the maximum of the differences between the values of pairs of consecutive digital samples within 10 decoded digital samples immediately preceding the given sample.

The adaptive limit may be further limited such that the adaptive limit is not allowed to exceed the absolute limit. Moreover, one or more additional adaptive limits may be employed, each preferably applicable to limit the value of the given sample with respect to a different preceding decoded digital sample and/or having the value limiting the difference thereto defined using a different predetermined rule.

Lost Frame Error Concealment

When frames are eventually lost in transmission and when there is no time for retransmissions because of the low latency requirements, the only possibility for decent error concealment is to generate a segment of data stream on the basis of the known specific properties of the signal to be concealed. In accordance with this invention we have chosen the phase aligned, cyclic play-back, FIGS. 27-29 of the stored earlier signal data 18, with loss management 49, and a smooth return from play-back algorithms 55, FIGS. 9, 19 and 27-32, as the means to handle the error concealment of lost frames. With the preferred example embodiment in accordance with the innovation, the sampling rate is set to 192 kHz and in order to be able to use this strategy with 24-bit samples down to the lower limit frequency of the audio band, 20 Hz, a signal history buffer of 40 KB is required, FIGS. 27 and 28, to store a full wave. To speed up the updating of the signal history buffer in the circular buffer wrap-around situations, we are using a small mirrored wrap-around zone 143, so that the bit error concealment by polynomial extrapolation or interpolation don't need to care about the wrap-around events. The circular signal history buffer illustrated in FIGS. 27 and 28 and is supported by pointers to the latest 141 and the previous 140 upward signal zero-crossing positions in addition to the signal history fill-in pointer, and the wrap-around link pointer 142. The lost frame concealment is shown as a pair of waveform graphs in FIG. 29.

Whenever loss of a frame is detected, the frame loss concealment method in accordance with an embodiment of this invention may be invoked, the relevant error counters are incremented, and a record is generated in the error log. Then the phase synchronization point is located by calculating how many sample points there were after the latest upward signal zero-crossing and then adjusting the play-back pointer to the same location from the beginning of the latest stored full signal wave as illustrated in FIG. 29. The latest waveform is then cyclically played back with wrap around from the latest stored signal zero-crossing point to the previous one as long as the next proper frame is captured or the limit for excessive frame loss is reached.

Excessive Loss of Frames

If the frame stream is lost for more than a few frames, the cyclic play-back of the recorded history data is no more sufficient to conceal the serious reception error situation. At a pre-set lost frame limit the fading process is invoked. It mutes down the output volume according to the programmable, pre-set fading parameters.

Smooth Return from Lost Frame Error Concealment

When the receiver is in the signal history play-back mode and the capture of the frames succeeds again, the smooth transition from the cyclic play-back to the normal stream of received signal needs to be done. In accordance with this invention it is done by replacing the last few play-back samples with polynomial estimates calculated with the help of the earlier points of the signal history buffer and the few samples in the very beginning of the just received fame. This is illustrated in FIG. 30 and in greater detail in FIG. 31. In our preferred example embodiment in accordance with this invention we again use the third order polynomial interpolation estimation to calculate the last five sample values 149 to be played-back based on two samples from the signal buffer just preceding them 148 and the two samples from the front of the just received frame 149. With this arrangement the absolute slew rate limit will never be exceeded no matter what the amplitude and phase relationship of those two signals is while the joint is established. The estimation algorithm for the five points is shown as a matrix calculation in FIG. 32 together with the derived formulas (6.1)-(6.5) for them.

Dynamic Channel Signal Generation

To gain the maximal system flexibility when using the multicast in accordance with this invention, the final output signal of each receiver station can optionally be generated as late as possible—in the receiver stations. This makes it possible to switch the roles of the receiver stations very rapidly and to fine tune them on-the-fly. This is shown in FIG. 26. In the preferred example embodiment in accordance with this invention the eight channel signals received in the multicast frames are either individually switched off 132 or fed to software attenuators 133 working under the directions of the channel mixer controller 137. The attenuators can be realized with a digital signal processing algorithm that implements the accurate attenuation by an integer multiplication followed by an integer division in such a way that the possibility of overflow in avoided. The selected and attenuated channel signals are finally digitally summed 134 and the result is fed to the receiver output drivers 136 through the signal history buffer 135.

Polynomial Re-Sampling

The polynomial interpolation estimation in accordance with this invention is also useful for improved quality digital audio signal re-sampling. In one of the preferred embodiments in accordance with this invention the cubic interpolation is used for the estimation of the new sample values when doubling the sampling rate, for example from 96 kHz to 192 kHz. Using linear interpolation based on the previous and the next sample values with 16 or 24 bit samples the residual error in the generated signal is of the order of −73 dB to −89 dB as compared to the ideal re-sampling while with the four point cubic estimation the level of −106 dB can be reached in both cases. This is very close to the performance of most of the commercial 24-bit audio digital to analog converters and vastly exceeds that of the 16-bit converters.

In other words, re-sampling a digital signal data stream comprising a sequence of individual digital samples from a first sampling rate to a second sampling rate where the second sampling rate is higher than the first sampling rate is provided. The re-sampling comprises interpolating the values of the digital samples to be introduced to the re-sampled signal using a cubic polynomial estimation described hereinbefore.

FIG. 35 shows an example of re-sampling as matrix calculation the four base point cubic re-sampling estimation, labeled as CRE-3/4, and results formulas for the very first generated re-sample $w_s$ (7.1), all the middle resamples $w_m$ (7.2), and the very last re-sample $w_e$ (7.3).

Various Embodiments of the Invention

The operations, procedures and/or functions described hereinbefore in context of the preferred embodiments of the invention may be provided, for example, as a method implementing the respective operations, procedures and/or functions, as an apparatus configured to implement the respective operations, procedures and/or functions or as a computer program or a computer program product configured to implement the respective operations, procedures and/or functions. Hence, the procedures and/or functions described hereinbefore in context of the preferred embodiments of the invention may be provided by software means, by hardware means or by a combination thereof.

As an example, procedures and/or functions described hereinbefore in context of the preferred embodiments of the invention may be provided by an apparatus for forward error concealment encoding of a digital signal data stream comprising a sequence of individual digital samples, the apparatus comprising means for encoding one or more of the individual digital samples according to an encoding mode selected from a number of predetermined encoding modes in accordance with a value of the respective digital sample, wherein encoding comprises determining an encoded digital sample as a combination of bits of the respective digital sample and a predetermined number of forward error concealment bits arranged into predetermined bit positions of the encoded digital sample in accordance with the selected encoding mode.

Similarly, as another example, procedures and/or functions described hereinbefore in context of the preferred embodiments of the invention may be provided by an apparatus for forward error concealment decoding of a digital signal data stream comprising a sequence of encoded individual digital samples, the apparatus comprising means for decoding one or more of the individual encoded samples into respective decoded digital samples according to a decoding mode selected from a number of predetermined decoding modes in accordance with a detected encoding mode of the respective encoded digital sample, wherein the encoding mode is detected on basis of the value of one or more bits of the encoded digital sample.

Figure 37:
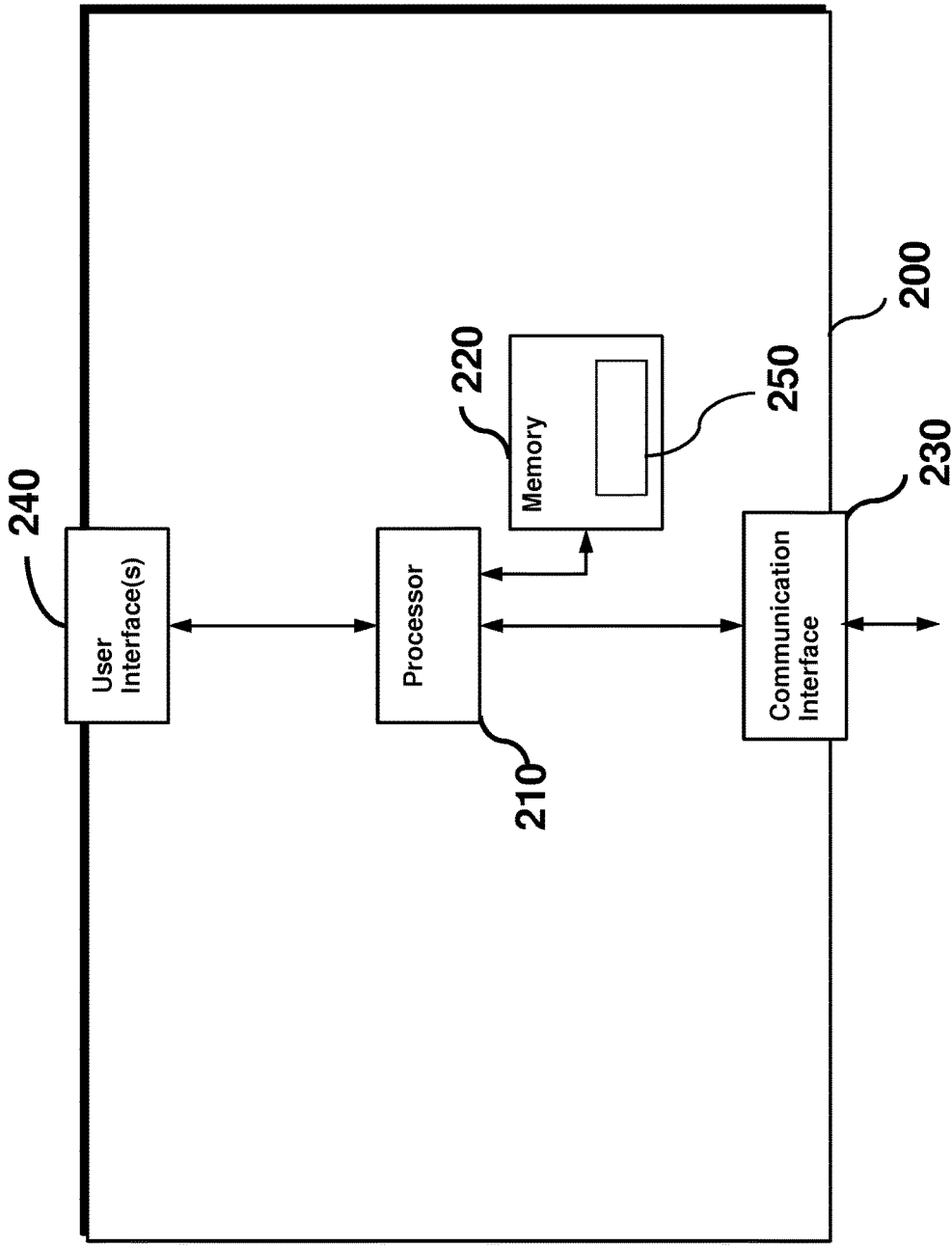
FIG. 37 schematically illustrates an exemplifying apparatus in accordance with an embodiment of the invention.

FIG. 37 schematically illustrates an exemplifying apparatus 200 comprising a processor 210, a memory 220 and a communication interface 230, such as a network card or a network adapter enabling wireless or wireline communication with another apparatus. The processor 210 is configured to read from and write to the memory 220. The apparatus 200 may further comprise a user interface 240 for providing data, commands and/or other input to the processor 210 and/or for receiving data or other output from the processor 210, the user interface 240 comprising for example one or more of a display, a keyboard or keys, a mouse or a respective pointing device, a touchscreen, etc. The apparatus 200 may comprise further components not illustrated in the example of FIG. 37.

Figure 38:
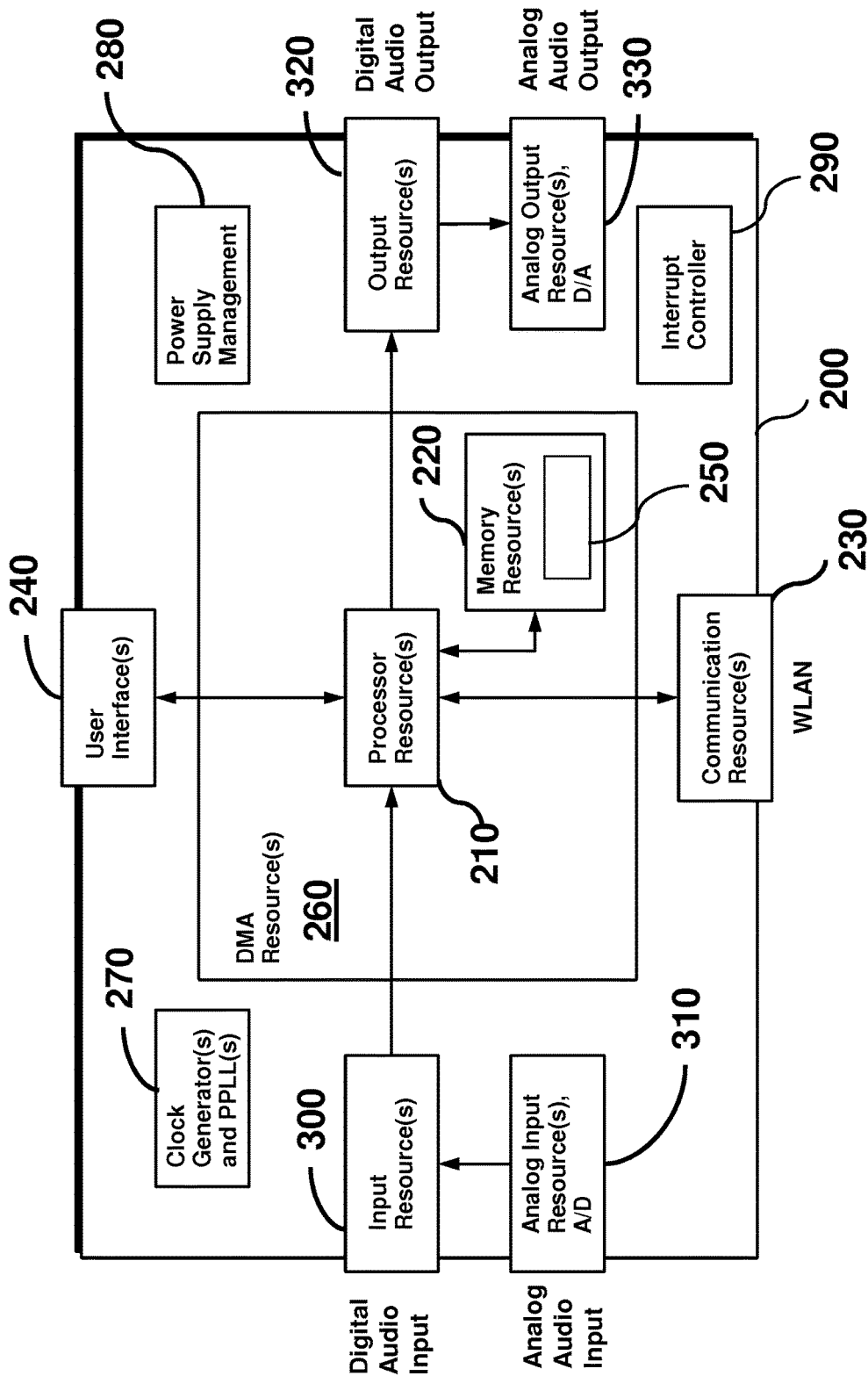
FIG. 38 schematically illustrates an exemplifying apparatus in accordance with an embodiment of the invention with additional hardware blocks for increasing the efficiency of the operation of the apparatus.

FIG. 38 schematically illustrates a second exemplifying apparatus 400 comprising the processor 210, the memory 220, the communication interface 230 and the user interface 240 described in context of the (first) exemplifying apparatus 200. The apparatus 400 may further comprise one or more of the following: direct memory access (DMA) resource(s) for facilitating access to the memory 220 independently of the processor 210, one or more clock generator(s) and programmable phase-locked loops (PPLL) 270 for facilitating synchronization of processing of signals at the apparatus 400, power supply management portion 280, an interrupt controller 290 for facilitating efficient handling of interruptions within the apparatus 400 in order to guarantee realtime provision of signals, input resources for (digital) audio signals 300, output resources for (digital) audio signals 320, one or more analog-to-digital (A/D) converters 310 for provision of analog audio input, and one or more digital-to-analog (D/A) converters 330 for provision of analog audio output. The apparatus 400 may comprise one or more further components not illustrated in the example of FIG. 38.

Although the processor 210 is presented in the examples of FIGS. 37 and 38 as a single component, the processor 210 may be implemented as one or more separate components. Although the memory 220 in the examples of FIGS. 37 and 38 is illustrated as single component, the memory 220 may be implemented as one or more separate components, some or all of which may be integrated/removable and/or may provide permanent/semi-permanent/dynamic/cached storage.

The memory 220 may store a computer program 250 comprising computer-executable instructions that control the operation of the apparatus 200 when loaded into the processor 210. As an example, the computer program 250 may include one or more sequences of one or more instructions. The computer program 250 may be provided as a computer program code. The processor 210 is able to load and execute the computer program 250 by reading the one or more sequences of one or more instructions included therein from the memory 220. The one or more sequences of one or more instructions may be configured to, when executed by one or more processors, cause an apparatus, for example the apparatus 200, to implement operations, procedures and/or functions described hereinbefore in context of the preferred embodiments of the invention.

Hence, the apparatus 200, 400 may comprise at least one processor 210 and at least one memory 220 including computer program code for one or more programs, the at least one memory 220 and the computer program code configured to, with the at least one processor 210, cause the apparatus 200, 400 to perform operations, procedures and/or functions described hereinbefore in context of the preferred embodiments.

The computer program 250 may be provided at the apparatus 200, 400 via any suitable delivery mechanism. As an example, the delivery mechanism may comprise at least one computer readable non-transitory medium having program code stored thereon, the program code which when executed by an apparatus cause the apparatus at least implement processing to carry out operations, procedures and/or functions described hereinbefore in context of the preferred embodiments of the invention. The delivery mechanism may be for example a computer readable storage medium, a computer program product, a memory device a record medium such as a CD-ROM, a DVD or other optical media, an article of manufacture that tangibly embodies the computer program 250. As a further example, the delivery mechanism may be a signal configured to reliably transfer the computer program 250.

Reference to a processor should not be understood to encompass only programmable processors, but also dedicated circuits such as field-programmable gate arrays (FPGA), application specific circuits (ASIC), signal processors, etc. Features described in the preceding description may be used in combinations other than the combinations explicitly described. Although functions have been described with reference to certain features, those functions may be performable by other features whether described or not. Although features have been described with reference to certain embodiments, those features may also be present in other embodiments whether described or not.

The invention claimed is:

1. A method for forward error concealment encoding of a digital audio signal data stream that includes a sequence of individual digital audio samples, carried out by an electronic device having an audio processor in connection with an electronic digital audio input interface and an electronic digital audio output interface, and in connection with a memory having executable program code that, upon execution by the audio processor, causes the audio processor to carry out the steps of the method, the method comprising:

receiving the digital audio signal data stream via the electronic input interface;

individually encoding one or more of the individual digital audio samples of the received digital audio signal data stream according to an encoding mode selected from a plurality of predetermined encoding modes in accordance with a value of the respective digital audio sample; and generating, at the electronic digital audio output interface, an output digital audio signal data stream comprising said encoded one or more of the individual digital audio samples, said encoding comprising the sub-step of determining an encoded digital audio sample as a combination of bits of the respective digital audio sample and a predetermined number of forward error concealment bits arranged into predetermined bit positions of the encoded digital audio sample in accordance with the selected encoding mode, said plurality of predetermined encoding modes comprising at least a first encoding mode and a second encoding mode, wherein a given digital audio sample is encoded according to the first encoding mode in response to the value of the given digital audio sample meeting a first predetermined criterion, and wherein the given digital audio sample is encoded according to the second encoding mode in response to the value of the given digital audio sample meeting the second predetermined criterion, the value of the given digital audio sample meeting the first predetermined criterion comprising the absolute value of the given digital audio sample, not exceeding a predetermined threshold value, and the value of the given digital audio sample meeting the second predetermined criterion comprising the absolute value of the given digital audio sample exceeding the predetermined threshold value, wherein said output digital audio signal data stream carries information consistent with the received digital audio signal data stream in a manner by which a receiver of said output digital audio signal data stream may conceal an error introduced during transmission of said output digital audio signal data stream.

2. The method according to claim 1, wherein encoding according to the first encoding mode comprises providing the given digital audio sample with a first number of forward error concealment bits, and encoding according to the second encoding mode comprises providing the given digital audio sample with a second number of forward error concealment bits, the first number of bits being larger than the second number of bits.

3. The method according to claim 1,
wherein the first encoding mode comprises replicating the bits in a first set of predefined bit positions of the given digital audio sample as the forward error concealment bits, and wherein the second encoding mode comprises using one's complement of the bits in a second set of predefined bit positions of the given digital audio sample as the forward error concealment bits.

4. The method according to claim 3,
wherein the given digital audio sample comprises 24 bits with bit 0 indicating the least significant bit position, and wherein the first set comprises bit positions from 8 to 15 of the given digital audio sample, the second set comprises bit positions from 20 to 23 of the given digital audio sample, and the second encoding mode further comprises using one's complement of a modulo-two sum of bit positions 0 to 3, 4 to 7, 8 to 11, 12 to 15, and 16 to 19 of the given digital audio sample as further for-ward error concealment bits.

5. The method according to claim 3,
wherein the given digital audio sample comprises 24 bits with bit 0 indicating the least significant bit position, and wherein the first set comprises bit positions from 8 to 15 of the given digital audio sample, and the second set comprises bit positions from 16 to 23 of the given digital audio sample.

6. The method according to claim 1, further comprising: transmitting said output digital audio signal data stream.

7. An electronic apparatus for forward error concealment encoding of a digital signal data stream that includes a sequence of individual digital audio samples, the apparatus comprising:

an audio processor;

an electronic digital audio input interface and an electronic digital audio output interface in connection with the audio processor; and at least one memory, in connection with the audio processor, the at least one memory having stored therein computer program code configured to, upon execution by the audio processor, cause the apparatus to:

receive, via the electronic digital audio input interface, the digital audio signal data stream;

individually encode one or more of the individual digital audio samples of the received digital audio signal data stream according to an encoding mode selected from a plurality of predetermined encoding modes in accordance with a value of the respective digital audio sample; and generating, at the electronic digital audio output interface, an output digital audio signal data stream comprising said encoded one or more of the individual digital audio samples, said encoding comprising determining an encoded digital audio sample as a combination of bits of the respective digital audio sample and a predetermined number of forward error concealment bits arranged into predetermined bit positions of the encoded digital audio sample in accordance with the selected encoding mode, said plurality of predetermined encoding modes comprising at least a first encoding mode and a second encoding mode, wherein a given digital audio sample is encoded according to the first encoding mode in response to the value of the given digital audio sample meeting a first predetermined criterion, and wherein the given digital audio sample is encoded according to the second encoding mode in response to the value of the given digital audio sample meeting the second predetermined criterion, the value of the given digital audio sample meeting the first predetermined criterion comprising the absolute value of the given digital audio sample not exceeding a predetermined threshold value, and the value of the given digital audio sample meeting the second predetermined criterion comprising the absolute value of the given digital audio sample exceeding the predetermined threshold value, wherein said output digital audio signal data stream carries information consistent with the received digital audio signal data stream in a manner by which a receiver of said output digital audio signal data stream may conceal an error introduced during transmission of said output digital audio signal data stream.

8. The apparatus according to claim 7, wherein encoding according to the first encoding mode comprises providing the given digital audio sample with a first number of forward error concealment bits, and encoding according to the second encoding mode comprises providing the given digital audio sample with a second number of forward error concealment bits, the first number of bits being larger than the second number of bits.

9. The apparatus according to claim 7, wherein the first encoding mode comprises replicating the bits in a first set of predefined bit positions of the given digital audio sample as the forward error concealment bits, and wherein the second encoding mode comprises using one's complement of the bits in a second set of predefined bit positions of the given digital audio sample as the forward error concealment bits.

10. The apparatus according to claim 9, wherein the given digital audio sample comprises 24 bits with bit 0 indicating the least significant bit position, and wherein the first set comprises bit positions from 8 to 15 of the given digital audio sample, and the second set comprises bit positions from 16 to 23 of the given digital audio sample.

11. The apparatus according to claim 10, wherein the first set further comprises bit positions from 0 to 7 of the given digital audio sample.

12. The apparatus according to claim 9, wherein the given digital audio sample comprises 24 bits with bit 0 indicating the least significant bit position, and wherein the first set comprises bit positions from 8 to 15 of the given digital audio sample, the second set comprises bit positions from 20 to 23 of the given digital audio sample, and the second encoding mode further comprises using one's complement of a modulo-two sum of bit positions 0 to 3, 4 to 7, 8 to 11, 12 to 15, and 16 to 19 of the given digital audio sample as further forward error concealment bits.

13. The apparatus according to claim 7, further comprising:

a transmitter, in connection with said electronic digital audio output interface, for transmitting said output digital audio signal data stream.

* * * * *